United States Patent
Iwamoto et al.

(10) Patent No.: US 10,469,055 B2
(45) Date of Patent: Nov. 5, 2019

(54) FILTER DEVICE INCLUDING LONGITUDINALLY COUPLED RESONATOR ELASTIC WAVE FILTER AND ELASTIC WAVE RESONATOR

(71) Applicant: Murata Manufacturing Co., Ltd., Nagaokakyo-shi, Kyoto-fu (JP)

(72) Inventors: Hideki Iwamoto, Nagaokakyo (JP); Keiji Okada, Nagaokakyo (JP); Yuichi Takamine, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 29 days.

(21) Appl. No.: 15/830,015

(22) Filed: Dec. 4, 2017

(65) Prior Publication Data
US 2018/0097508 A1    Apr. 5, 2018

Related U.S. Application Data

(63) Continuation of application No. PCT/JP2016/067572, filed on Jun. 13, 2016.

(30) Foreign Application Priority Data

Jun. 24, 2015  (JP) ................. 2015-126675

(51) Int. Cl.
*H03H 9/145* (2006.01)
*H03H 9/56* (2006.01)
(Continued)

(52) U.S. Cl.
CPC ........ *H03H 9/568* (2013.01); *H03H 9/02031* (2013.01); *H03H 9/02574* (2013.01);
(Continued)

(58) Field of Classification Search
CPC ...... H03H 9/568; H03H 9/706; H03H 9/6436; H03H 9/14594; H03H 9/14532;
(Continued)

(56) References Cited

U.S. PATENT DOCUMENTS 6,121,860 A  *  9/2000  Tsutsumi ............ H03H 9/0028
                                                          310/313 D
7,576,471 B1 *  8/2009  Solal .................. H03H 9/02858
                                                          310/313 B
(Continued)

FOREIGN PATENT DOCUMENTS

JP     2000-286663 A    10/2000
JP     2011-182220 A     9/2011
(Continued)

OTHER PUBLICATIONS

Official Communication issued in International Patent Application No. PCT/JP2016/067572, dated Aug. 30, 2016.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A filter device includes a longitudinally coupled resonator elastic wave filter that includes IDT electrodes including low acoustic velocity regions in outer side portions of center regions of the IDT electrodes and high acoustic velocity regions in outer side portions of the low acoustic velocity regions in a direction orthogonal or substantially orthogonal to an elastic wave propagation direction, and defines and functions as a first bandpass filter, and elastic wave resonators that are electrically connected to the longitudinally coupled resonator elastic wave filter.

20 Claims, 17 Drawing Sheets

(51) Int. Cl.
*H03H 9/02* (2006.01)
*H03H 9/13* (2006.01)
*H03H 9/17* (2006.01)
*H03H 9/205* (2006.01)
*H03H 9/70* (2006.01)
*H03H 9/64* (2006.01)
*H03H 9/72* (2006.01)

(52) U.S. Cl.
CPC ........ *H03H 9/132* (2013.01); *H03H 9/14532* (2013.01); *H03H 9/14594* (2013.01); *H03H 9/178* (2013.01); *H03H 9/205* (2013.01); *H03H 9/6436* (2013.01); *H03H 9/6483* (2013.01); *H03H 9/6496* (2013.01); *H03H 9/706* (2013.01); *H03H 9/725* (2013.01)

(58) Field of Classification Search
CPC .. H03H 9/02031; H03H 9/6483; H03H 9/725; H03H 9/205; H03H 9/178; H03H 9/132; H03H 9/02574
USPC .......................................... 333/133, 193–196
See application file for complete search history.

(56) References Cited

U.S. PATENT DOCUMENTS

| | | | |
|---|---|---|---|
| 2007/0018755 A1* | 1/2007 | Mayer | H03H 9/02881 333/193 |
| 2008/0315972 A1* | 12/2008 | Mayer | H03H 9/02881 333/193 |
| 2011/0068655 A1* | 3/2011 | Solal | H03H 9/02858 310/313 B |
| 2011/0215883 A1 | 9/2011 | Fujiwara et al. | |
| 2013/0051588 A1 | 2/2013 | Ruile et al. | |
| 2013/0249647 A1 | 9/2013 | Nakanishi et al. | |
| 2013/0285768 A1 | 10/2013 | Watanabe et al. | |
| 2016/0126932 A1 | 5/2016 | Nakai et al. | |

FOREIGN PATENT DOCUMENTS

| | | |
|---|---|---|
| JP | 2013-544041 A | 12/2013 |
| KR | 10-2012-0120355 A | 11/2012 |
| KR | 10-2013-0086378 A | 8/2013 |
| WO | 2012/086639 A1 | 6/2012 |
| WO | 2014/196245 A1 | 12/2014 |

* cited by examiner

FREQUENCY (MHz)

FREQUENCY (MHz)

FILTER DEVICE INCLUDING LONGITUDINALLY COUPLED RESONATOR ELASTIC WAVE FILTER AND ELASTIC WAVE RESONATOR

CROSS REFERENCE TO RELATED APPLICATIONS

This application claims the benefit of priority to Japanese Patent Application No. 2015-126675 filed on Jun. 24, 2015 and is a Continuation Application of PCT Application No. PCT/JP2016/067572 filed on Jun. 13, 2016. The entire contents of each application are hereby incorporated herein by reference.

BACKGROUND OF THE INVENTION

1. Field of the Invention

The present invention relates to a filter device including a piezoelectric film including $LiTaO_3$.

2. Description of the Related Art

International Publication No. WO 2012/086639 A1 discloses an elastic wave device provided by laminating, on a support substrate, a high acoustic velocity film, a low acoustic velocity film, an $LiTaO_3$ film, and an IDT (interdigital transducer) electrode in this order. In International Publication No. WO 2012/086639 A1, surface acoustic waves propagating in the $LiTaO_3$ film are provided.

On the other hand, the following Japanese Unexamined Patent Application Publication No. 2000-286663 discloses a surface acoustic wave resonator including a 15°-rotated Y-cut X-propagation $LiTaO_3$ film. In the surface acoustic wave resonator, a straight line connecting the front ends of first electrode fingers of an IDT electrode and a straight line connecting the front ends of second electrode fingers thereof are inclined by about 18° to about 72° with respect to the propagation direction of surface acoustic waves.

One problem that the elastic wave device disclosed in International Publication No. WO 2012/086639 A1 has is that transverse mode ripples are generated in frequency characteristics.

On the other hand, in Japanese Unexamined Patent Application Publication No. 2000-286663, transverse modes reflected by one busbar and transverse modes reflected by the other busbar cancel each other. With this cancellation, the transverse modes are able to be significantly reduced or prevented.

One problem with the elastic wave device disclosed in International Publication No. WO 2012/086639 A1 however is that a Q value is deteriorated when upper and lower busbars are inclined with respect to the propagation direction of the elastic waves. Accordingly, when a filter device includes a surface acoustic wave resonator resulting from a combination of International Publication No. WO 2012/086639 A1 and Japanese Unexamined Patent Application Publication No. 2000-286663, there is a risk that insertion loss is deteriorated.

SUMMARY OF THE INVENTION

Preferred embodiments of the present invention provide filter devices that are able to significantly reduce or prevent deterioration in insertion loss, significantly increase a Q value, and significantly reduce or prevent transverse mode ripples.

A filter device according to a preferred embodiment of the present invention includes a longitudinally coupled resonator elastic wave filter that includes a plurality of first IDT electrodes including low acoustic velocity regions in outer side portions of center regions of the IDT electrodes and high acoustic velocity regions in outer side portions of the low acoustic velocity regions in a direction orthogonal or substantially orthogonal to an elastic wave propagation direction, and that defines and functions as a first bandpass filter, and an elastic wave resonator that is electrically connected to the longitudinally coupled resonator elastic wave filter, wherein each of the longitudinally coupled resonator elastic wave filter and the elastic wave resonator includes a piezoelectric film including $LiTaO_3$, and a high acoustic velocity member with an acoustic velocity of propagating bulk waves, which is higher than an acoustic velocity of elastic waves propagating in the piezoelectric film, the piezoelectric film is laminated directly or indirectly on the high acoustic velocity member, the plurality of first IDT electrodes are longitudinally coupled and connected on one surface of the piezoelectric film, the elastic wave resonator includes a second IDT electrode located on one surface of the piezoelectric film, the second IDT electrode includes a plurality of first electrode fingers and a plurality of second electrode fingers which interpose with the first electrode fingers, a film thickness of the piezoelectric film including the $LiTaO_3$ is equal to or smaller than about $10\lambda$ when a wavelength determined by a pitch of the electrode fingers of the second IDT electrode is $\lambda$, and a direction connecting front ends of the plurality of first electrode fingers and a direction connecting front ends of the plurality of second electrode fingers define an inclination angle of ν (ν is a positive value of larger than 0°) with respect to a propagation direction φ of elastic waves excited by the second IDT electrode, which is determined by Euler Angles ($\phi$, $\theta$, $\varphi$) of the $LiTaO_3$.

In another preferred embodiment of the present invention, the thickness of the piezoelectric film is equal to or smaller than about $1.5\lambda$.

In another preferred embodiment of the present invention, the elastic wave resonator is included in a plurality of elastic wave resonators, and the plurality of elastic wave resonators are electrically connected to provide a second bandpass filter. In this case, a composite filter device including the first bandpass filter and the second bandpass filter is able to be provided.

According to another preferred embodiment of the present invention, it is preferable that the second bandpass filter be a ladder filter. In this case, the second bandpass filter is able to significantly reduce or prevent transverse mode ripples more effectively while significantly reducing or preventing deterioration in insertion loss more effectively.

In another preferred embodiment of the present invention, a filter device which is a duplexer including the longitudinally coupled resonator elastic wave filter as a reception filter and the second bandpass filter as a transmission filter is provided.

In another preferred embodiment of the present invention, the first bandpass filter and the second bandpass filter are provided on a single chip component. In this case, the filter device is easily mounted and an electronic apparatus on which the filter device is mounted is able to be reduced in size.

In another preferred embodiment of the present invention, the high acoustic velocity member is a high acoustic velocity support substrate.

In another preferred embodiment of the present invention, the elastic wave resonator further includes a support substrate, and the high acoustic velocity member is a high acoustic velocity film and is provided on the support substrate.

In another preferred embodiment of the present invention, a low acoustic velocity film with an acoustic velocity of propagating bulk waves, which is lower than the acoustic velocity of the elastic waves propagating in the piezoelectric film, is laminated between the high acoustic velocity member and the piezoelectric film, and the piezoelectric film is laminated indirectly on the high acoustic velocity member.

In another preferred embodiment of the present invention, the piezoelectric film is laminated directly on the high acoustic velocity member.

In another preferred embodiment of the present invention, each of the first IDT electrodes includes a first busbar, a second busbar spaced away from the first busbar, a plurality of first electrode fingers base ends of which are electrically connected to the first busbar and front ends of which extend toward the second busbar, and a plurality of second electrode fingers base ends of which are connected to the second busbar and front ends of which extend toward the first busbar, and in each of the first IDT electrodes of the longitudinally coupled resonator elastic wave filter, when a direction orthogonal or substantially orthogonal to a direction in which the first and second electrode fingers extend is a width direction, at least one of each of the first and second electrode fingers includes large width portions with larger dimensions in the width direction than dimensions of portions of the first and second electrode fingers at a center in a lengthwise direction at at least one side of the base end side and the front end side relative to the center in the lengthwise direction, at least one of the first and second busbars includes a plurality of cavities which are located along a lengthwise direction of the first or second busbar, and each of the first and second busbars includes an inner busbar portion which is located at a side of the first or second electrode fingers relative to the cavities and extends in the lengthwise direction of the first and second busbars, a center busbar portion in which the cavities are provided, and an outer busbar portion located at an opposite side to the inner busbar portion with the center busbar portion interposed between the outer busbar portion and the inner busbar portion.

In another preferred embodiment of the present invention, the inner busbar portion has a band shape extending in the elastic wave propagation direction.

In another preferred embodiment of the present invention, both of the first electrode fingers and the second electrode fingers include the large width portions. In this case, the transverse mode ripples are able to be significantly reduced or prevented more effectively.

In another preferred embodiment of the present invention, each of the first IDT electrodes includes a first busbar, a second busbar spaced away from the first busbar, a plurality of first electrode fingers base ends of which are electrically connected to the first busbar and front ends of which extend toward the second busbar, and a plurality of second electrode fingers base ends of which are connected to the second busbar and front ends of which extend toward the first busbar, and when a region in which the plurality of first electrode fingers and the plurality of second electrode fingers overlap with each other in the elastic wave propagation direction is an intersection region, the intersection region includes the center regions in the direction orthogonal or substantially orthogonal to the elastic wave propagation direction and the low acoustic velocity regions provided in the outer side portions of the center regions, and the first and second electrode fingers are increased in thickness in the low acoustic velocity regions. An acoustic velocity in the low acoustic velocity regions is lower than the acoustic velocity in the center regions.

In another preferred embodiment of the present invention, each of the first IDT electrodes includes a first busbar, a second busbar spaced away from the first busbar, a plurality of first electrode fingers base ends of which are electrically connected to the first busbar and front ends of which extend toward the second busbar, and a plurality of second electrode fingers base ends of which are connected to the second busbar and front ends of which extend toward the first busbar, and a dielectric film that lowers an acoustic velocity is laminated on the first and second electrode fingers in the low acoustic velocity regions.

In another preferred embodiment of the present invention, the dielectric film laminated on the first and second electrode fingers extends along the elastic wave propagation direction.

In another preferred embodiment of the present invention, a duty in the first IDT electrodes of the longitudinally coupled resonator elastic wave filter is equal to or lower than about 0.46. In this case, the transverse mode ripples are able to be significantly reduced or prevented more effectively.

In another preferred embodiment of the present invention, the inclination angle $v$ is in a range of equal to or larger than about 0.4° and equal to or smaller than about 15°. In this case, the insertion loss is able to be further reduced.

Filter devices according to preferred embodiments of the present invention are able to reduce insertion loss, significantly increase a Q value, and significantly reduce or prevent transverse mode ripples.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that respective preferred embodiments which are described in the specification are exemplary and partial replacement or combination of components between different preferred embodiments is able to be included.

Figure 1A:
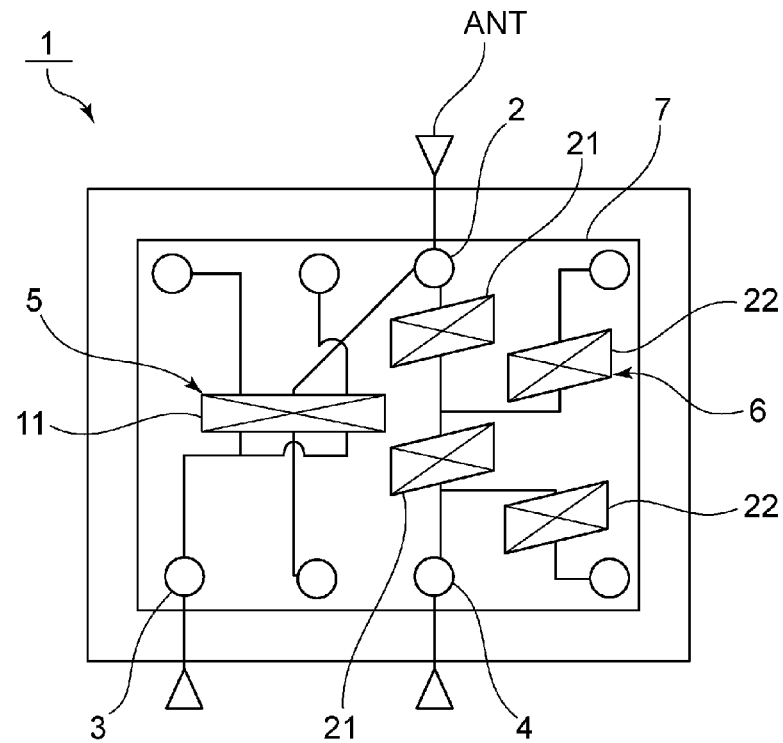
FIG. 1A is a schematic plan view of a filter device according to a first preferred embodiment of the present invention and FIG. 1B is a plan view illustrating an electrode structure of an elastic wave resonator.

FIG. 1A is a schematic plan view of a filter device according to a first preferred embodiment of the present invention.

A filter device 1 is included as a duplexer of a cellular phone. The filter device 1 includes an antenna terminal 2, a reception terminal 3, and a transmission terminal 4. The antenna terminal 2 is connected to an antenna ANT. A first bandpass filter 5 as a reception filter is connected between the antenna terminal 2 and the reception terminal 3. A second bandpass filter 6 as a transmission filter is connected between the antenna terminal 2 and the transmission terminal 4.

The first bandpass filter 5 includes a longitudinally coupled resonator elastic wave filter 11 that implements a piston mode. The piston mode is a technique of significantly reducing or preventing transverse modes. The piston mode will be described more specifically with reference to FIG. 23 to FIG. 26.

FIG. 23 to FIG. 26 are schematic plan views showing the piston mode. In a first example illustrated in FIG. 23, an IDT electrode 201 includes a first busbar 202 and a second busbar 203. First ends of a plurality of first electrode fingers 204 are connected to the first busbar 202. A plurality of second electrode fingers 205 is connected to the second busbar 203. The plurality of first electrode fingers 204 and the plurality of second electrode fingers 205 interpose each other. As acoustic velocities of respective regions are indicated at the right side in FIG. 23, low acoustic velocity regions are provided in outer side regions relative to a center region in an intersection region in which the plurality of first electrode fingers 204 and the second electrode fingers 205 overlap with each other in the elastic wave propagation direction. High acoustic velocity regions are provided in further outer side regions of the low acoustic velocity regions.

As described above, the low acoustic velocity regions are provided in the outer side regions of the center region in the intersection region and the high acoustic velocity regions are provided in the further outer side regions of the low acoustic velocity regions in the direction orthogonal or substantially orthogonal to the elastic wave propagation direction, thus significantly reducing or preventing the transverse modes by implementing the piston mode.

Figure 23:
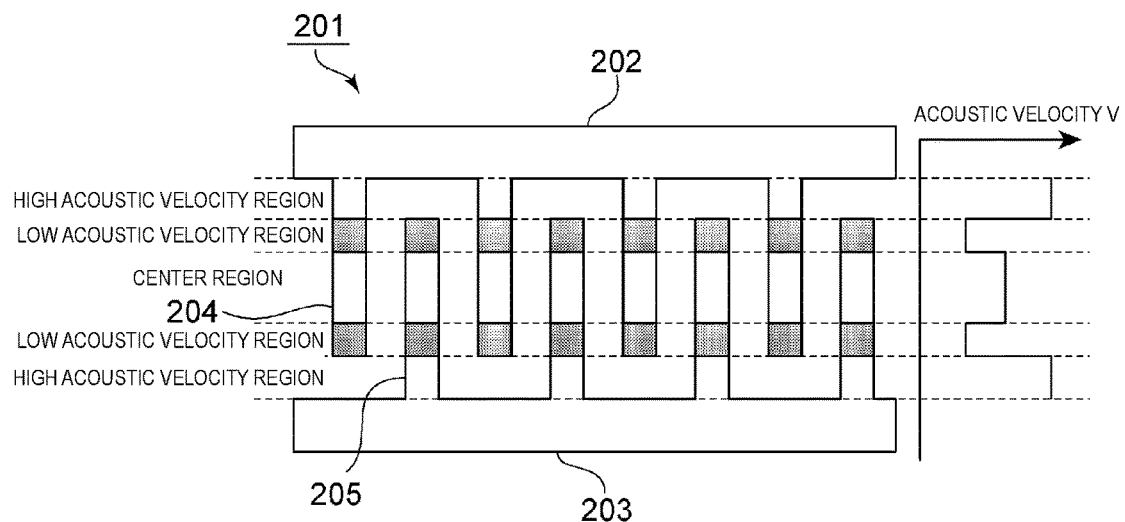
FIG. 23 is a schematic plan view illustrating a first example of a structure of an IDT electrode that implements the piston mode.
Figure 24:
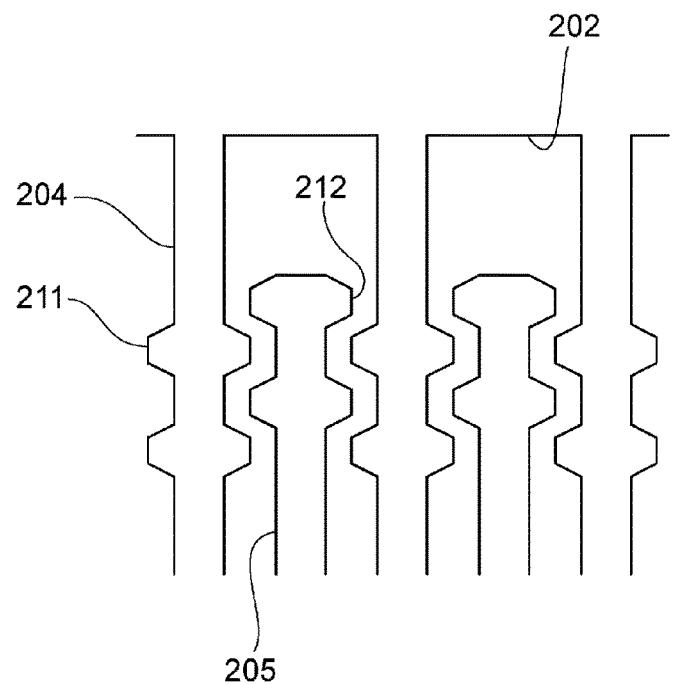
FIG. 24 is a schematic plan view illustrating a second example of the structure of the IDT electrode that implements the piston mode.
Figure 25:
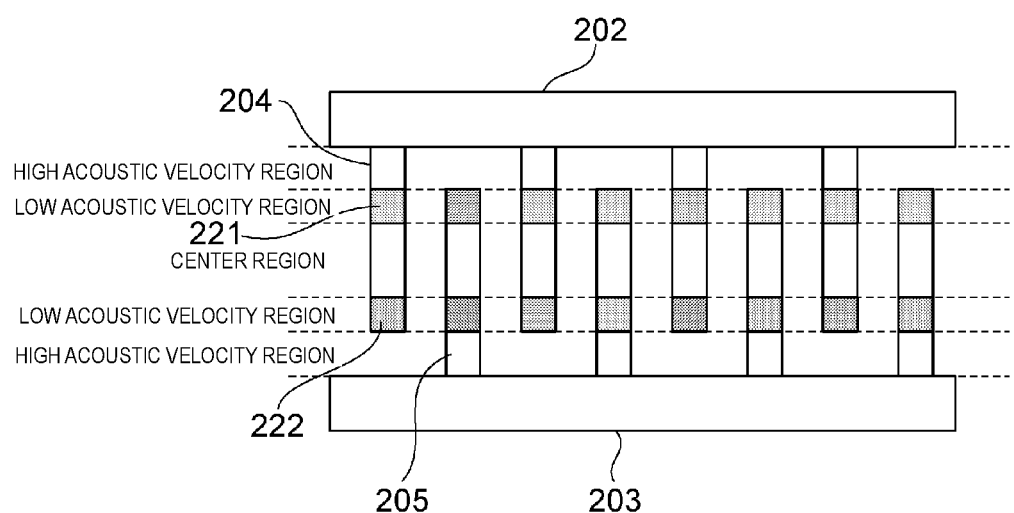
FIG. 25 is a schematic plan view illustrating a third example of the structure of the IDT electrode that implements the piston mode.

In FIG. 23, the film thickness of a metal film is increased in the low acoustic velocity regions to lower the acoustic velocity in the low acoustic velocity regions. A method of providing the low acoustic velocity regions and the high acoustic velocity regions is not limited to that in FIG. 23. As in a second example illustrated in FIG. 24, the low acoustic velocity regions may be provided by providing large width portions 211 and 212 in the first electrode fingers 204 and the second electrode fingers 205. Furthermore, as in a third example illustrated in FIG. 25, the low acoustic velocity regions may be provided by laminating dielectric films 221 and 222 on portions of the first electrode fingers 204 and the second electrode fingers 205.

A method of forming the high acoustic velocity regions is also not particularly limited. As illustrated in FIG. 23, a method in which no dummy electrode is provided between the front ends of the electrode fingers and the mating busbars may be provided. Alternatively, a material increasing the acoustic velocity may be located in the high acoustic velocity regions.

Figure 26:
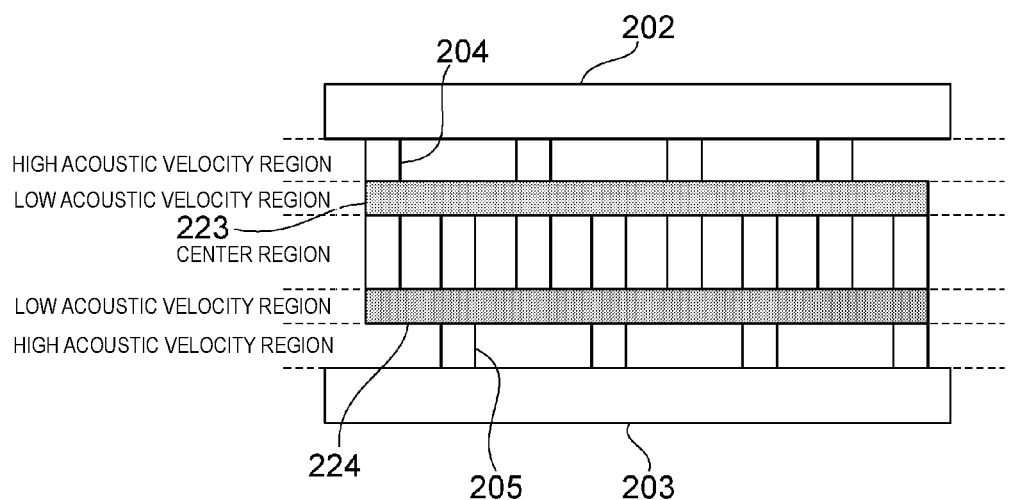
FIG. 26 is a schematic plan view illustrating a fourth example of the structure of the IDT electrode that implements the piston mode.

Furthermore, as in a fourth example illustrated in FIG. 26, dielectric films 223 and 224 may extend in the elastic wave propagation direction to define the low acoustic velocity regions.

The structure in the piston mode may provide a method of forming the low acoustic velocity portions and the high acoustic velocity portions as long as the relation for the acoustic velocity in FIG. 23 is achieved.

Figure 14:
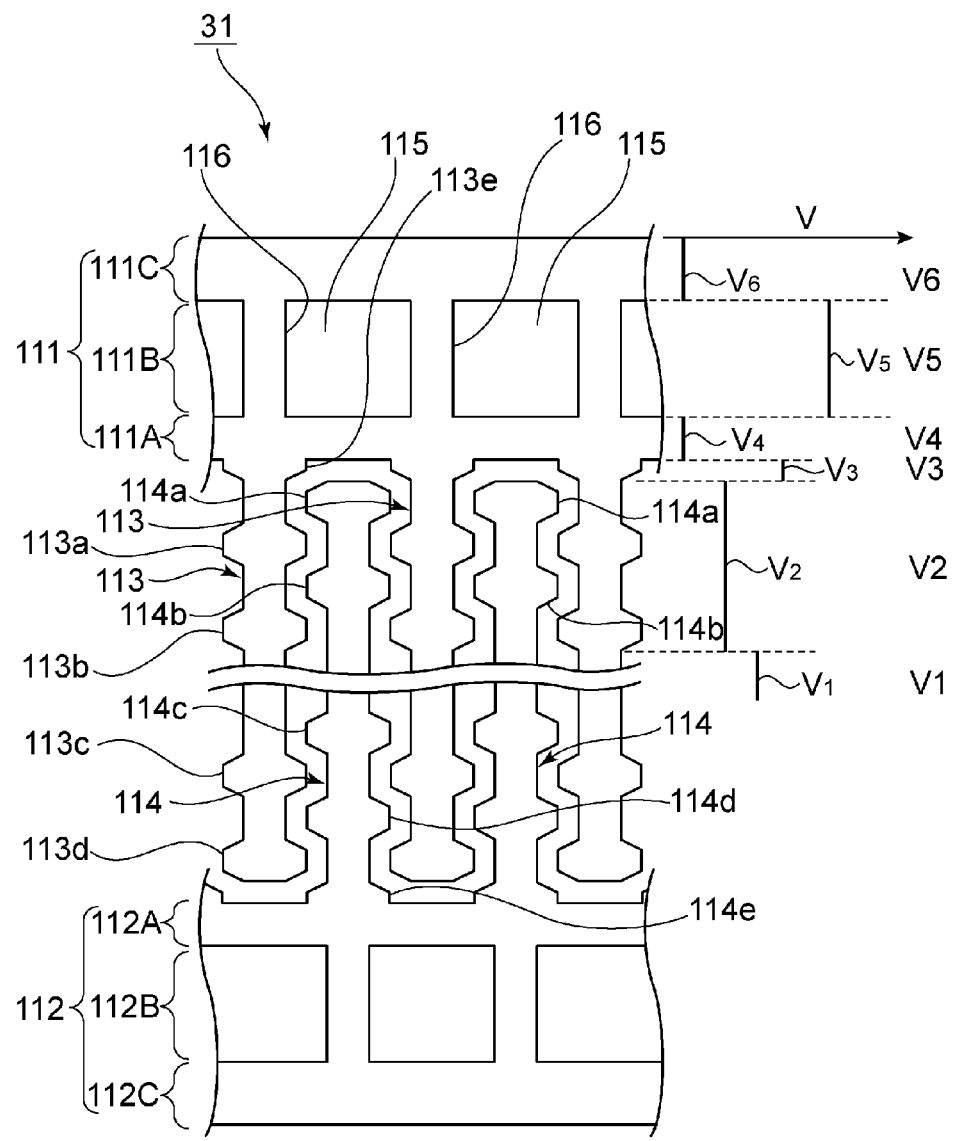
FIG. 14 is a partially cutout plan view illustrating an example of an electrode structure that implements a piston mode in the first preferred embodiment of the present invention.

Moreover, as illustrated in an inner busbar portion 111A in FIG. 14, large width portions may be provided at the ends of the electrode fingers and a thin busbar structure may be provided. This structure is able to provide an elastic wave device that is able to significantly reduce or prevent the transverse mode ripples without causing a manufacturing process to be complicated and increasing cost.

The second bandpass filter 6 is a ladder filter. The ladder filter includes a plurality of elastic wave resonators 21 and 21 as series arm resonators and a plurality of elastic wave resonators 22 and 22 as parallel arm resonators. FIG. 1A schematically illustrates the circuitry of the above-described longitudinally coupled resonator elastic wave filter 11 and the above-described ladder filter and this circuitry is provided by disposing electrodes on an LiTaO$_3$ film 7.

The filter device 1 is able to significantly reduce or prevent the transverse mode ripples because the first bandpass filter 5 implements the piston mode. The specific features and elements of the filter device implementing the piston mode are not particularly limited. The detail of the longitudinally coupled resonator elastic wave filter 11 will be described later.

The plurality of elastic wave resonators 21 and 22 defining the second bandpass filter 6 will be described with respect to the elastic wave resonator 21 as a representative component.

Figure 2:
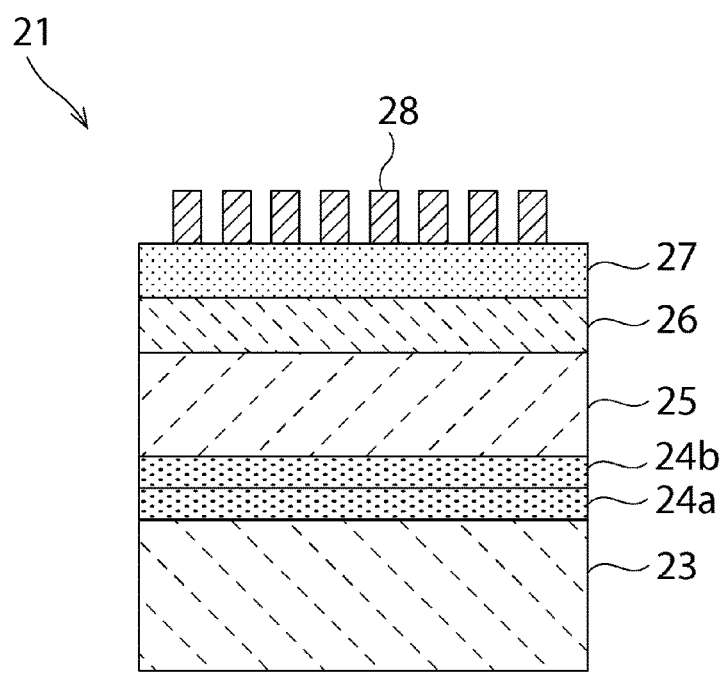
FIG. 2 is a schematic cross-sectional front view of the elastic wave resonator that is included in a second bandpass filter in the first preferred embodiment of the present invention.

FIG. 2 is a schematic cross-sectional front view of the elastic wave resonator 21.

As illustrated in FIG. 2, the elastic wave resonator 21 includes a support substrate 23. Bonding material layers 24a and 24b are laminated on the support substrate 23. A high acoustic velocity film 25 as a high acoustic velocity member is laminated on the bonding material layers 24a and 24b. A low acoustic velocity film 26 is laminated on the high acoustic velocity film 25. A piezoelectric film 27 including LiTaO$_3$ is laminated on the low acoustic velocity film 26.

A material of the piezoelectric film is not particularly limited but any of LiTaO$_3$, LiNbO$_3$, ZnO, AlN, or PZT may be preferably included, for example. An IDT electrode 28 is located on the piezoelectric film 27. The support substrate 23 includes silicon in the first preferred embodiment. A material of the support substrate 23 is not particularly limited. A semiconductor material other than silicon may be included. Alternatively, an insulating material, for example, glass or insulating ceramics may be included.

As the material of the support substrate 23, for example, silicon is a preferable material in the first preferred embodiment. In particular, a resistivity thereof is preferably equal to or higher than about 100 Ωcm, more preferably equal to or higher than about 1000 Ωcm, much more preferably equal to or higher than about 4000 Ωcm, for example. As the resistivity is increased, capacitance coupling between an electrode, which will be described layer, and the support substrate 23 is able to be significantly reduced or prevented. Accordingly, insertion loss is able to be further reduced.

Furthermore, silicon has a low thermal expansion coefficient. Accordingly, expansion and contraction of films and the like provided on the support substrate 23 due to change in temperature are able to be significantly reduced or prevented. Accordingly, frequency fluctuation due to thermal load is able to be significantly reduced or prevented, thus further enhancing temperature characteristics. In the example, the thickness of an Si support substrate was set to about 62.5λ. Moreover, silicon has high heat conductivity, thus efficiently dissipating heat generated in the filter device. Thus, electric power handling capacity is able to be significantly improved.

In addition, the support substrate 23 including silicon is excellent in workability. Accordingly, the support substrate is able to be easily manufactured. Furthermore, the support substrate 23 is able to be easily cut with a dicing machine. The support substrate 23 provides high flexural strength and therefore is able to provide a reduction in thickness of the filter device.

The bonding material layers 24a and 24b include silicon oxide in the first preferred embodiment. A bonding material other than silicon oxide may be included. A material of the bonding material layers 24a and 24b is not particularly limited as long as the bonding material layers 24a and 24b are able to bond the high acoustic velocity film 25 to the support substrate 23.

As a material of the high acoustic velocity film, any of various types of ceramics, for example, aluminum nitride, aluminum oxide, silicon carbide, silicon nitride, a DLC film, silicon, sapphire, alumina, cordierite, mullite, steatite, and forsterite, magnesia, diamond, materials containing the above-described respective materials as main components, and materials containing mixtures of the above-described respective materials as main components are preferably included. The high acoustic velocity film 25 includes aluminum nitride in the first preferred embodiment. The high acoustic velocity film 25 is able to be any appropriate material as long as the material provides an acoustic velocity of propagating bulk waves, which is higher than that of elastic waves propagating in the piezoelectric film 27.

The acoustic velocity of the bulk waves is unique to a material and the bulk waves include P waves vibrating in a wave traveling direction, that is, a longitudinal direction and S waves vibrating in a transverse direction as a direction perpendicular or substantially perpendicular to the traveling direction. The above-described bulk waves also propagate in all of the piezoelectric film 27, the high acoustic velocity film 25, and the low acoustic velocity film 26. When an isotropic material is included, the P waves and the S waves are present. When an anisotropic material is included, the P waves, slow S waves, and fast S waves are present. When the surface acoustic waves are excited by the anisotropic material, SH waves and SV waves are generated as the two S waves. In the specification, the acoustic velocity of the elastic waves of a main mode, which propagate in the piezoelectric film 27, indicates that of a mode that provides a pass band as a filter and resonance characteristics as a resonator among three modes of the P waves, the SH waves, and the SV waves.

The low acoustic velocity film preferably includes, for example, any of silicon oxide, glass, silicon oxynitride, tantalum oxide, a compound provided by adding fluorine, carbon, or boron to silicon oxide, and materials containing the above-described respective materials as main components. The low acoustic velocity film 26 includes silicon oxide in the first preferred embodiment. The low acoustic velocity film 26 is able to include any appropriate material as long as the material provides an acoustic velocity of the propagating bulk waves, which is lower than the acoustic velocity of the elastic waves propagating in the piezoelectric film 27.

A close contact layer may be provided between the high acoustic velocity film 25 and the piezoelectric film 27. When the close contact layer is included, a close contact property between the high acoustic velocity film 25 and the piezoelectric film 27 is able to be significantly improved. The close contact layer may include resin or metal, and for example, an epoxy resin or polyimide resin is included.

The high acoustic velocity film 25 is laminated at the lower side of the low acoustic velocity film 26 in the first preferred embodiment. Therefore, energy of the elastic waves is able to be confined in a portion to the high acoustic velocity film 25.

The above-described IDT electrode 28 includes an Al film in the first preferred embodiment. The IDT electrode 28 may include an alloy film containing the Al film as a main body instead of the Al film. Furthermore, the IDT electrode 28 is able to include various metal materials other than Al or alloy containing Al as the main body. Examples of the metal materials include Cu, Mo, W, Ag, Pd, and alloys containing any of these materials.

The elastic wave resonator 21 provides the characteristics that an inclination angle ν, which will be described later, is a positive numerical value of larger than 0° in the IDT electrode 28. With the characteristics, ripples due to the transverse modes are able to be significantly reduced or prevented. Preferably, the inclination angle ν is preferably in a range of equal to or larger than about 0.4° and equal to or smaller than about 15°, for example. With the inclination angle, the transverse mode ripples are able to be significantly reduced or prevented more effectively.

Figure 27:
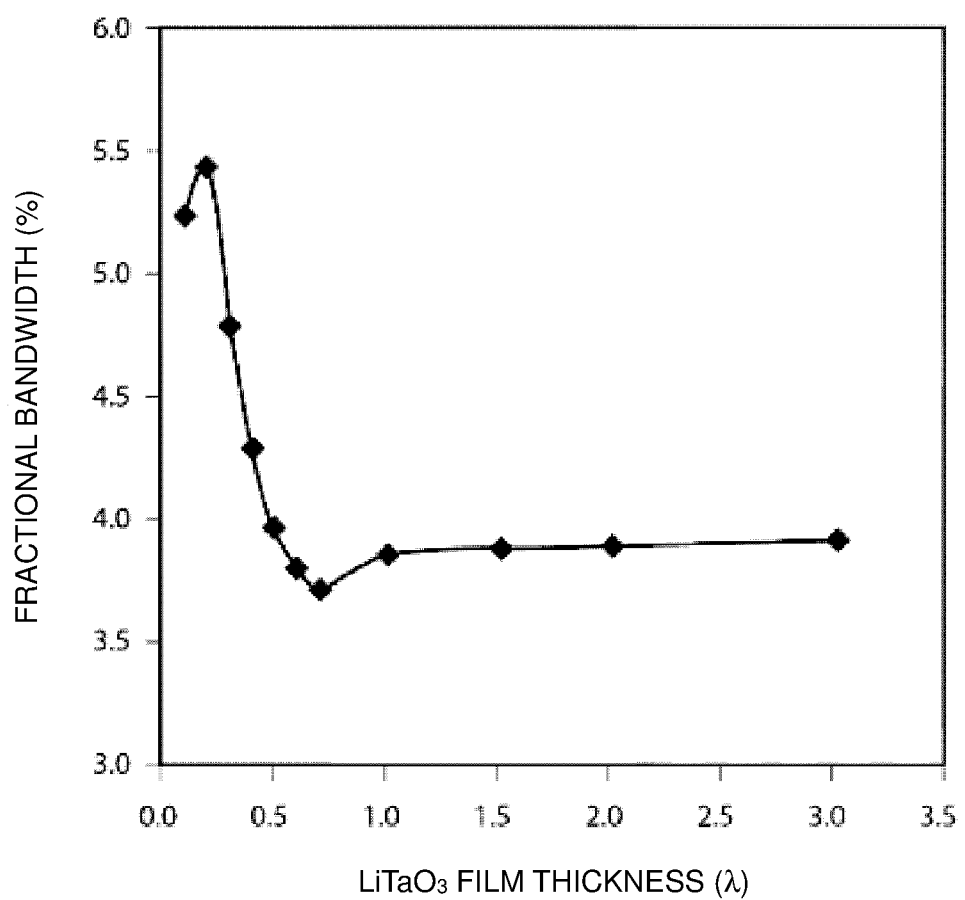
FIG. 27 is a graph illustrating a relation between the film thickness of $LiTaO_3$ and a fractional bandwidth.

In the elastic wave resonator 21 including the high acoustic velocity film 25 and the low acoustic velocity film 26, the ripples due to the transverse modes tend to be generated in frequency characteristics. When an $LiNbO_3$ substrate is included as disclosed in Japanese Unexamined Patent Application Publication No. 2000-286663, generation of the transverse mode ripples is significant and gives an influence on other characteristics. On the other hand, usage of an $LiTaO_3$ substrate causes no problem related to the transverse mode ripples. However, in the structure including the $LiTaO_3$ film, the low acoustic velocity film, the high acoustic velocity film, and the support substrate, generation of the transverse mode ripples is significant although $LiTaO_3$ is included. In particular, when the film thickness of the $LiTaO_3$ film is equal to or smaller than about 10λ, the transverse mode ripples are largely generated. In the first preferred embodiment, the above-described inclination angle ν is set to be in the above-described specific range, thus significantly reducing or preventing the transverse mode ripples more effectively. This feature will be described in detail below. The film thickness of the $LiTaO_3$ film is preferably equal to or smaller than about 3.5λ, for example. In this case, Q characteristics are able to be significantly improved. Furthermore, the film thickness of the $LiTaO_3$ film is preferably equal to or smaller than about 2.5λ, for example. In this case, a temperature coefficient of resonant frequency is able to be significantly decreased. The film thickness of the $LiTaO_3$ film is equal to or smaller than about 2.0λ more preferably, and an absolute value of TCF is able to be equal to or lower than about −10 ppm/° C., for example. It should be noted that the film thickness of the $LiTaO_3$ film is more preferably equal to or smaller than about 1.5λ, for example. FIG. 27 is a graph illustrating a relation between the film thickness of the $LiTaO_3$ film and a fractional bandwidth. The fractional bandwidth has a proportional relation with an electromechanical coupling coefficient. The electromechanical coupling coefficient is able to be easily adjusted by selecting the film thickness of the $LiTaO_3$ film in a range of equal to or smaller than about 1.5λ.

Figure 1B:
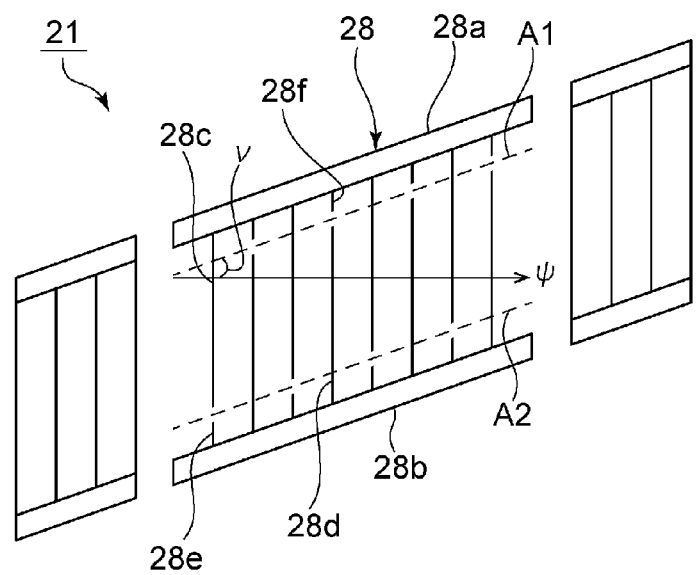

The above-described inclination angle ν will be described with respect to the IDT electrode 28 as a representative component. As illustrated in FIG. 1B, the IDT electrode 28 includes a first busbar 28a extending in a direction inclined with respect to the elastic wave propagation direction. A second busbar 28b is spaced away from the first busbar 28a. The second busbar 28b is also inclined with the same or similar angle as that of the first busbar 28a with respect to the elastic wave propagation direction. The first busbar 28a and the second busbar 28b extend in parallel or substantially in parallel with each other.

First ends of a plurality of first electrode fingers 28c are connected to the first busbar 28a. The plurality of first electrode fingers 28c extends toward the second busbar 28b side. A direction orthogonal or substantially orthogonal to the first electrode fingers 28c corresponds to the elastic wave propagation direction φ. Furthermore, a plurality of second electrode fingers 28d are provided, and the plurality of second electrode fingers 28d and the plurality of first electrode fingers 28c interpose each other. One ends of the plurality of second electrode fingers 28d are connected to the second busbar 28b.

First dummy electrode fingers 28e are provided with gaps from the front ends of the first electrode fingers 28c. The first dummy electrode fingers 28e are connected to the second busbar 28b. Second dummy electrode fingers 28f are located with gaps from the front ends of the first electrode fingers 28d. The second dummy electrode fingers 28f are connected to the first busbar 28a.

A virtual line A1 connecting the front ends of the plurality of second electrode fingers 28d defines an angle of ν with respect to the elastic wave propagation direction φ in the IDT electrode 28. It should be noted that a direction of a virtual line A2 connecting the front ends of the first electrode fingers 28c is the same or substantially the same as the direction of the virtual line A1 connecting the front ends of the second electrode fingers 28d.

Figure 3:
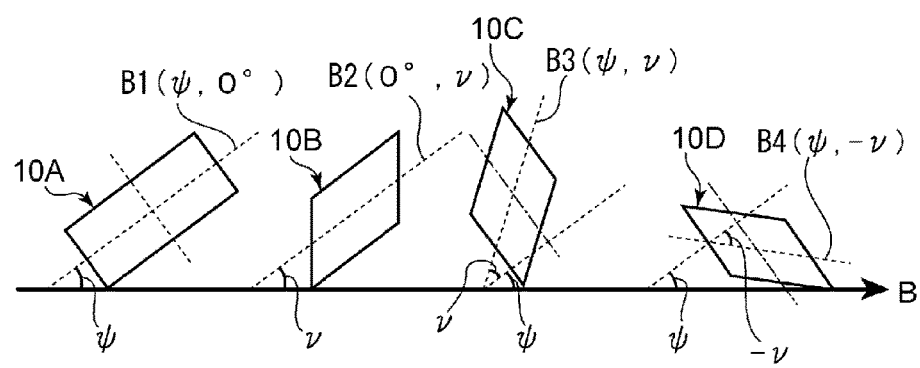
FIG. 3 is a schematic view showing a propagation direction $\varphi$ and an inclination angle $v$.

FIG. 3 is a schematic view showing a relation between the propagation direction φ and the inclination angle ν. Euler Angles of $LiTaO_3$ are expressed by (φ, θ, ψ). A direction indicated by an arrow B in FIG. 3 is a direction of φ=0°. Dashed lines B1 to B4 for IDT electrodes 10A to 10D are directions that are parallel with directions connecting the front ends of a plurality of first electrode fingers in the respective IDT electrodes 10A to 10D. In the IDT electrode 10A, the direction B1 is the same or substantially the same direction as the propagation direction φ in which elastic waves propagate. Accordingly, in this case, the direction B1 is expressed by (φ, 0°) when being expressed by (propagation direction of elastic waves, inclination angle ν with respect to propagation direction). In the IDT electrode 10B, the direction B2 is expressed by (0°, ν). In the IDT electrode 10C, the direction B3 is expressed by (φ, ν). In the IDT electrode 10D, the direction B4 is expressed by (φ, −ν).

In the specification, an angle defined by the propagation direction φ and the direction connecting the front ends of the first electrode fingers 28c of the IDT electrode 28 is the inclination angle ν. An IDT electrode with the inclination angle ν that is a positive numerical value of larger than 0° is hereinafter abbreviated as an inclination IDT in some cases.

Next, as the above-described elastic wave resonator 21, characteristics of an elastic wave resonator including a portion in which the one IDT electrode 28 is provided will be described.

Design parameters of the above-described elastic wave resonator are set as follows.

Piezoelectric thin film: Y-cut LiTaO$_3$ film with Cut-Angles of about 55°

Intersecting width of electrode fingers of IDT electrode=about 15λ

Number of pairs of electrode fingers=83 pairs

λ=about 2 μm

Offset length L=about 2λ

Duty in IDT electrode=about 0.5

Film thickness of IDT electrode=about 0.08λ

Film thickness of LiTaO$_3$ film=about 0.3λ

Film thickness of silicon oxide films providing bonding material layers=about 0.35λ

Gap dimension G=about 0.5 μm

An elastic wave resonator in a comparative example 1 was manufactured in accordance with the above-described design parameters. It should be noted that the inclination angle ν was set to 0°.

Figure 4:
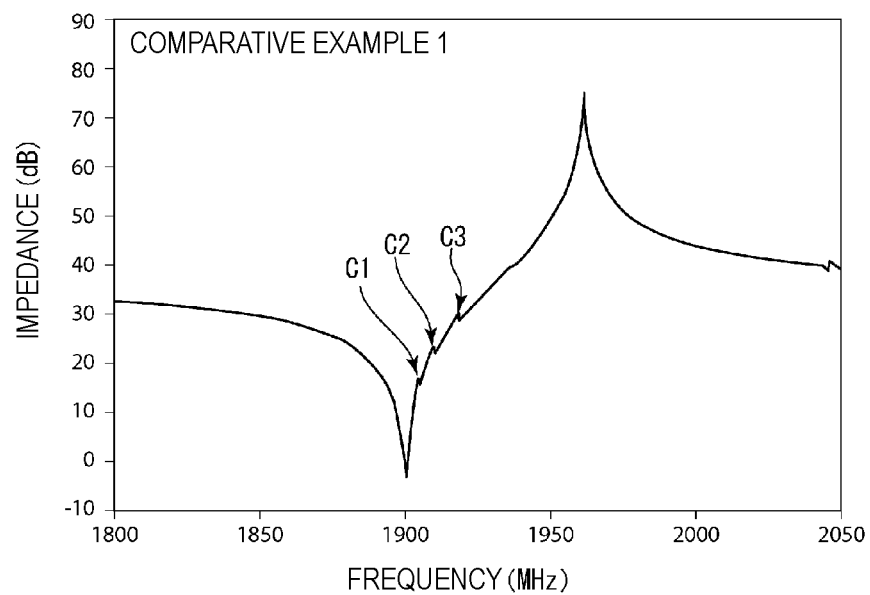
FIG. 4 is a graph illustrating impedance characteristics of an elastic wave resonator in a comparative example 1 in which the inclination angle is 0°.
Figure 6:
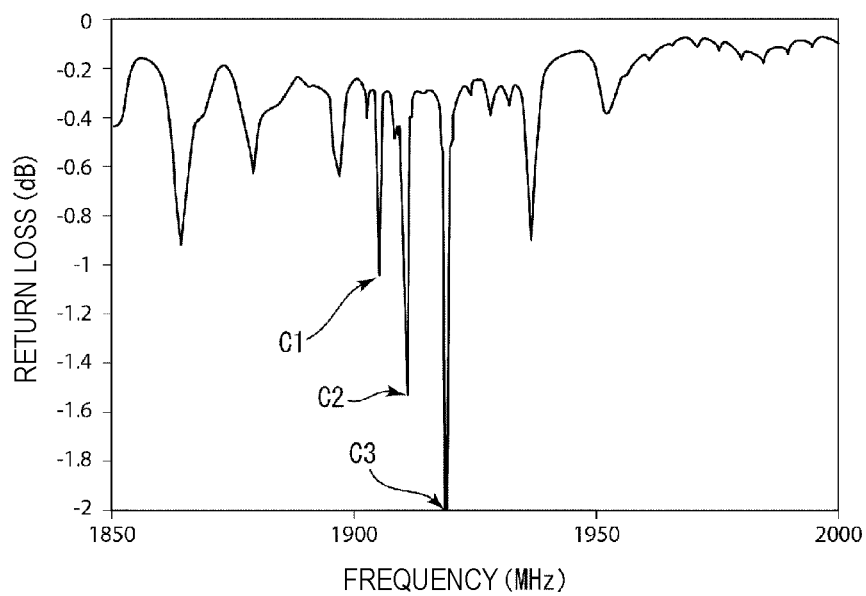
FIG. 6 is a graph illustrating return loss characteristics of the elastic wave resonator in the comparative example 1 in which the inclination angle $v$ is 0°.

FIG. 4 is a graph illustrating impedance characteristics of the elastic wave resonator in the comparative example 1. FIG. 6 indicates return loss characteristics of the elastic wave resonator in the above-described comparative example 1. In the elastic wave resonator in the comparative example 1, the inclination angle ν was set to 0°. That is, the propagation direction φ was identical or substantially identical to the straight line connecting the front ends of first electrode fingers.

Figure 5:
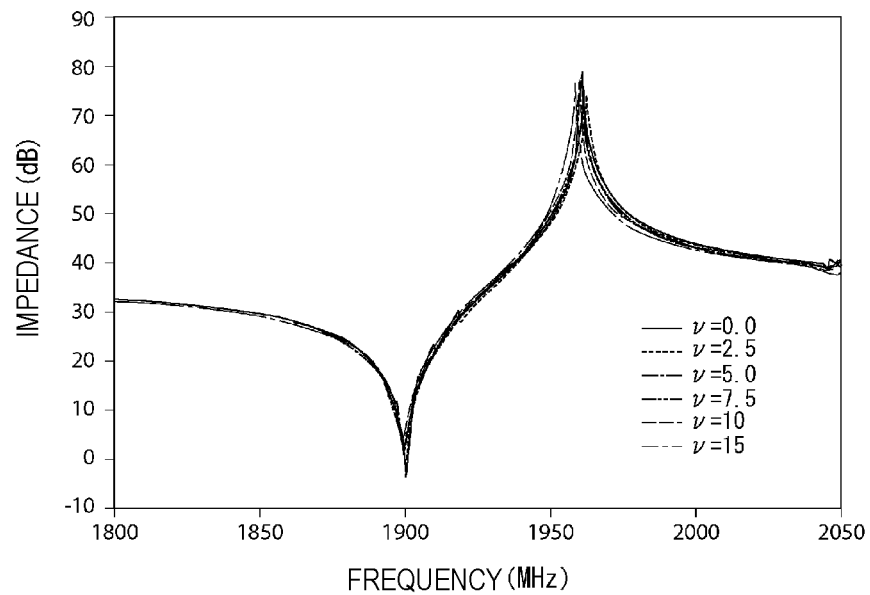
FIG. 5 is a graph illustrating change in the impedance characteristics of elastic wave resonators when the inclination angle $v$ is changed.

Furthermore, similar to the comparative example 1, elastic wave resonators in which the inclination angles ν in the IDT electrodes were about 2.5°, about 5.0°, about 7.5°, about 10°, and about 15°, for example, were manufactured. FIG. 5 also illustrates the characteristics in the comparative example 1 in which ν is 0.0° together.

FIG. 5 illustrates impedance characteristics of these elastic wave resonators.

Figure 7:
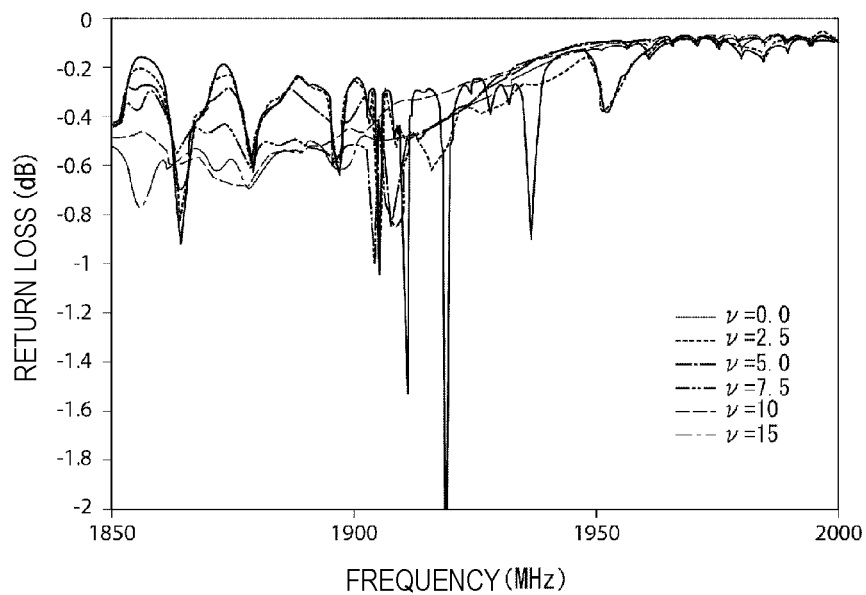
FIG. 7 is a graph illustrating change in the return loss characteristics when the inclination angle $v$ is changed.

FIG. 7 illustrates return loss characteristics of the elastic wave resonators when the inclination angles ν are 0.0°, about 2.5°, about 5.0°, about 7.5°, about 10°, and about 15° as described above.

Figure 8:
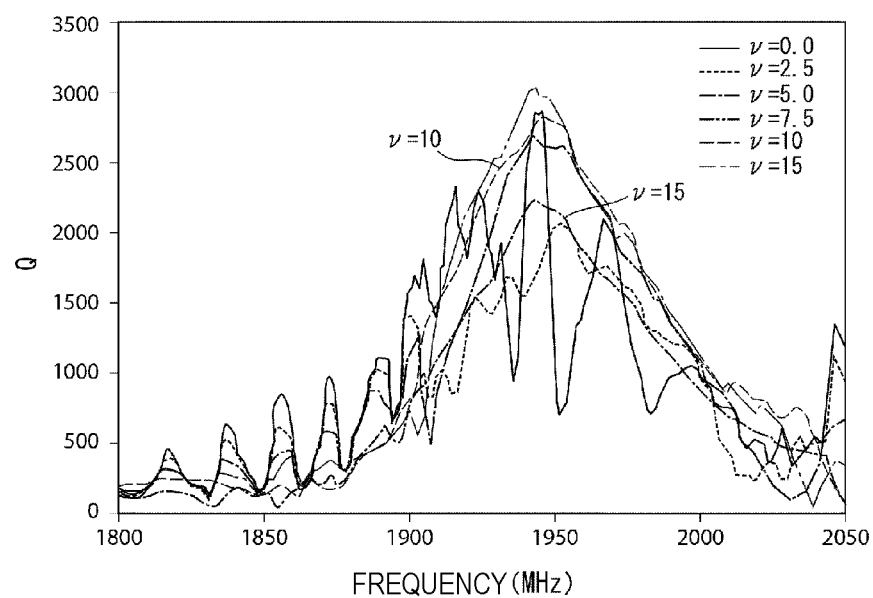
FIG. 8 is a graph illustrating change in a Q value when the inclination angle $v$ is changed.

FIG. 8 illustrates relations between Q values and frequencies of the respective elastic wave resonators when the above-described inclination angles ν are 0.0°, about 2.5°, about 5.0°, about 7.5°, about 10°, and about 15°, for example.

As shown in FIG. 4, in the comparative example 1 in which the inclination angle ν is 0°, ripples indicated by arrows C1 to C3 are generated between a resonant frequency and an anti-resonant frequency. Arrows C1 to C3 in FIG. 6 indicate ripples corresponding to the ripples indicated by the arrows C1 to C3 in FIG. 4.

Although not shown in FIG. 5, the return loss characteristics in FIG. 7 and the Q value-frequency characteristics in FIG. 8 show that when ν is larger than 0°, these transverse mode ripples are significantly reduced or prevented.

As shown in FIG. 7, it is confirmed that as ν is larger than 0°, the transverse mode ripples are significantly reduced or prevented in comparison with the case in which ν is 0°.

Figure 9:
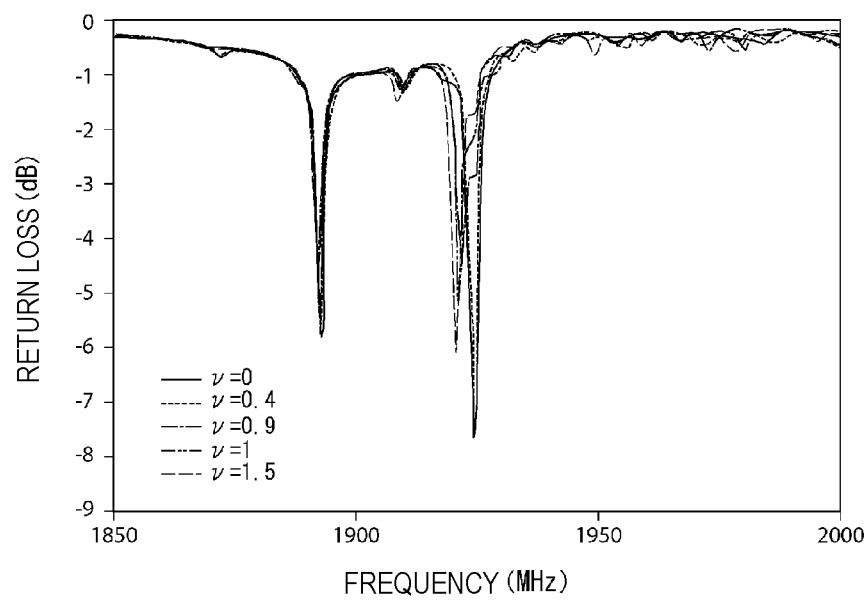
FIG. 9 is a graph illustrating change in the return loss characteristics when the inclination angle ν is changed.
Figure 10:
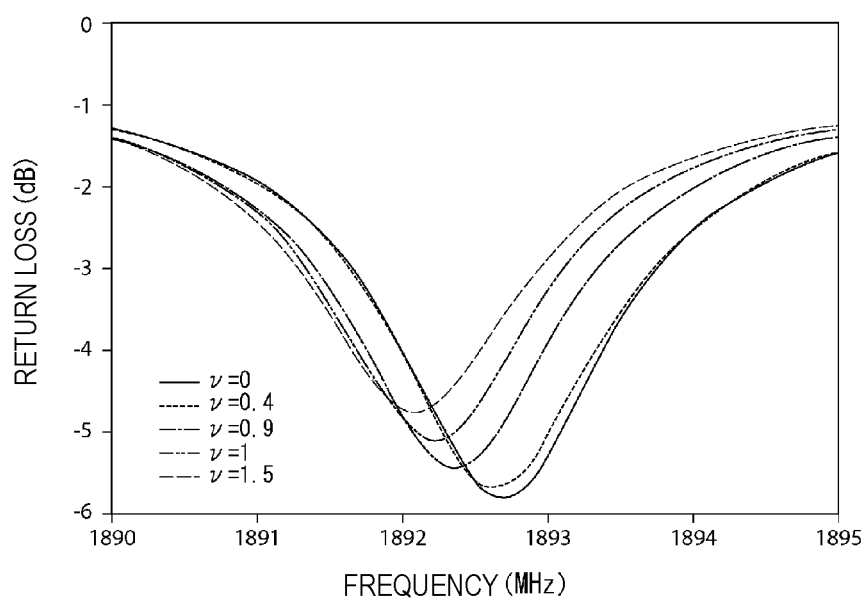
FIG. 10 is an enlarged view of FIG. 9 and is a graph illustrating change in the return loss characteristics when the inclination angle ν is changed.

As in the described above, elastic wave resonators in which the above-described inclination angles ν were 0°, about 0.4°, about 0.9°, about 1°, and about 1.5°, for example, were manufactured. FIG. 9 and FIG. 10 illustrate return loss characteristics of these elastic wave resonators. FIG. 10 is an enlarged view of FIG. 9.

As shown in FIG. 9 and FIG. 10, it is confirmed that when the inclination angle ν is equal to or larger than about 1°, the transverse mode ripples are able to be significantly reduced or prevented more effectively in comparison with the cases in which the inclination angle ν is 0°, about 0.4°, and about 0.9°.

Accordingly, when the above-described inclination angle ν is larger than 0°, the transverse mode ripples are able to be significantly reduced or prevented. It is preferable that ν be equal to or larger than about 0.4°, for example. The transverse mode ripples are able to thereby be further significantly reduced or prevented. In particular, as illustrated in FIG. 7, when ν is equal to or larger than about 2.5°, an absolute value of the return loss is able to be smaller than about 1 dB. Therefore, for example, when ν is equal to or larger than about 1° more preferably, and ν is equal to or larger than about 2.5° most preferably, the transverse mode ripples are able to be further significantly reduced or prevented.

FIG. 8 shows that ν is preferably equal to or smaller than about 10°, for example, to provide a maximum or substantially maximum value of the Q value that is equal to or larger than 2500, to thereby significantly decrease loss. Accordingly, it is preferable that the inclination angle ν be in a range of equal to or larger than about 1° and equal to or smaller than about 10°, for example. With the inclination angle ν, the transverse mode ripples are able to be significantly reduced or prevented and the loss is significantly decreased. It is more preferable that the inclination angle ν be in a range of equal to or larger than about 2.5° and equal to or smaller than about 10°, for example.

Furthermore, FIG. 8 reveals that the inclination angle ν is preferably equal to or larger than about 5°, for example, to further significantly decrease the loss. Therefore, it is more preferable that the inclination angle ν be in a range of equal to or larger than about 5° and equal to or smaller than about 10°, for example.

The elastic wave resonator 21 is able to significantly reduce or prevent the transverse mode ripples as described above. All of the plurality of elastic wave resonators 21 include features and elements as described above and the plurality of elastic wave resonators 22 also include the same or similar structure. Accordingly, the second bandpass filter 6 is able to significantly reduce or prevent the transverse mode ripples.

Figure 11A:
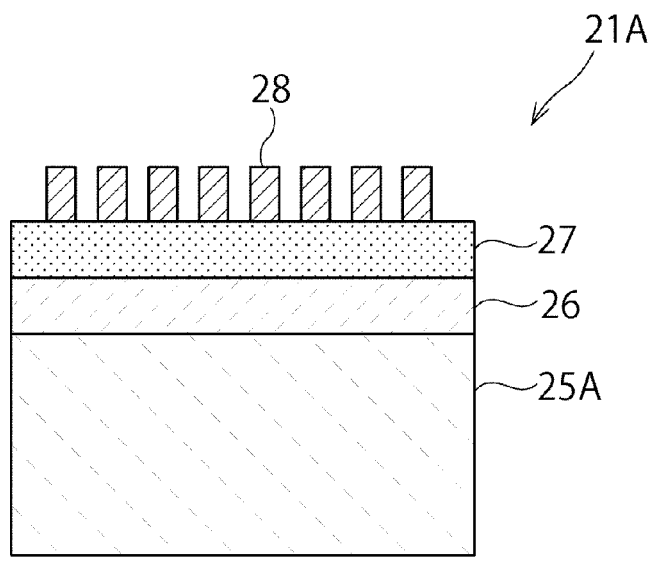
FIGS. 11A and 11B are schematic cross-sectional front views of first and second variations on the elastic wave resonator that is included in the second bandpass filter.
Figure 11B:
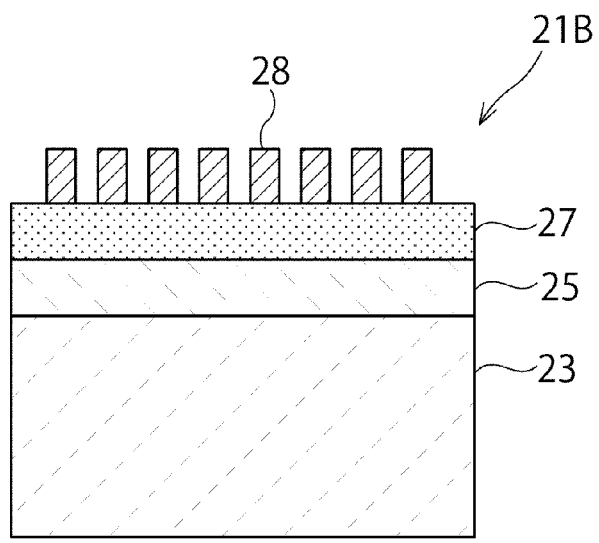

FIGS. 11A and 11B are schematic cross-sectional front views of elastic wave resonators 21A and 21B in first and second variations on the above-described elastic wave resonator 21.

As illustrated in FIG. 11A, the structure in which the low acoustic velocity film 26 and the piezoelectric film 27 are laminated on a high acoustic velocity support substrate 25A as a high acoustic velocity member may be provided.

In the first preferred embodiment and FIG. 11A, the piezoelectric film 27 is laminated on the high acoustic velocity member with the low acoustic velocity film 26 interposed therebetween. That is, the piezoelectric film 27 is laminated indirectly on the high acoustic velocity member.

As in the second variation illustrated in FIG. 11B, the high acoustic velocity film 25 and the piezoelectric film 27 may be laminated. That is, the low acoustic velocity film 26 may be omitted. In such a case, the piezoelectric film 27 is laminated directly on the high acoustic velocity film 25 as the high acoustic velocity member.

Figure 12:
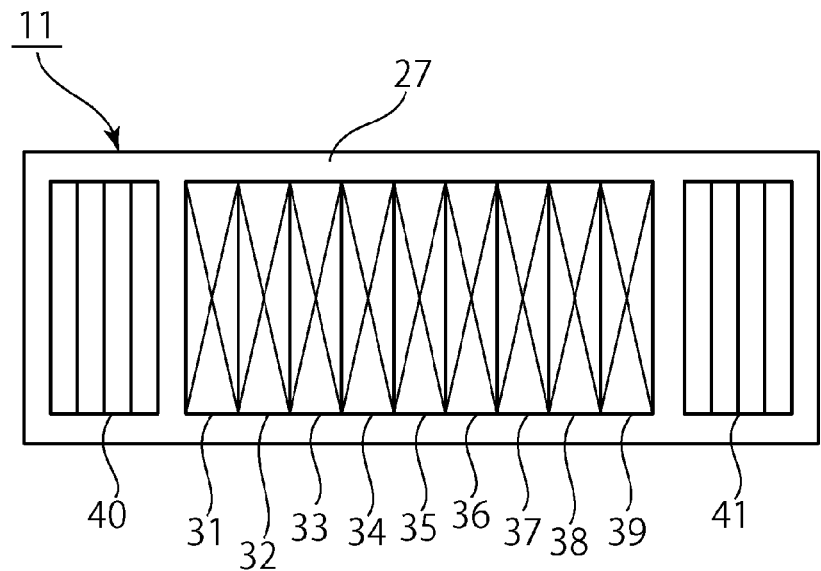
FIG. 12 is a schematic plan view of a longitudinally coupled resonator elastic wave filter as a first bandpass filter that is included in the filter device in the first preferred embodiment of the present invention.

FIG. 12 is a schematic plan view of the longitudinally coupled resonator elastic wave filter 11 defining the first bandpass filter 5 in the filter device 1. In the longitudinally coupled resonator elastic wave filter 11, a plurality of first IDT electrodes 31 to 39 are located along the elastic wave propagation direction on the piezoelectric film 27. Reflectors 40 and 41 are provided at both sides of a region in which the first IDT electrodes 31 to 39 are provided in the elastic wave propagation direction. The longitudinally coupled resonator elastic wave filter 11 is a 9-IDT type longitudinally coupled resonator elastic wave filter. It is sufficient that the number of first IDT electrodes in the longitudinally coupled resonator elastic wave filter 11 is an odd number of equal to or larger than about 3 and it is not limited to about 9.

Figure 13:
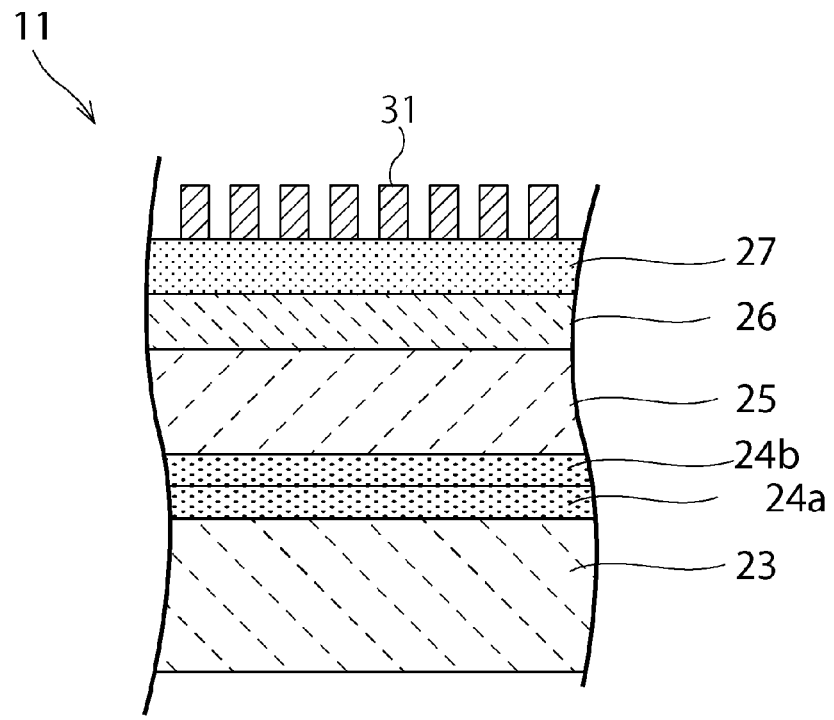
FIG. 13 is a schematic cross-sectional front view showing a lamination structure in the longitudinally coupled resonator elastic wave filter that is included in the first preferred embodiment of the present invention.

FIG. 13 is a schematic cross-sectional front view showing a lamination structure in the above-described longitudinally coupled resonator elastic wave filter 11. In the longitudinally coupled resonator elastic wave filter 11, the bonding material layers 24a and 24b, the high acoustic velocity film 25, the low acoustic velocity film 26, and the piezoelectric film 27 including LiTaO₃ are laminated in this order on the support substrate 23 as in the elastic wave resonators 21. The first IDT electrode 31 is provided on the piezoelectric film 27. Although FIG. 13 illustrates only a portion in which the first IDT electrode 31 is provided, portions in which the other first IDT electrodes 32 to 39 are provided also include the same or similar lamination structure.

Also in the longitudinally coupled resonator elastic wave filter 11, the lamination structure including the high acoustic velocity member, the high acoustic velocity film, and the low acoustic velocity film is included as described above. Accordingly, as in the second bandpass filter 6 side, energy of elastic waves is able to be confined in a portion to the high acoustic velocity film 25.

The first IDT electrodes 31 to 39 are described in detail with respect to the first IDT electrode 31 as a representative component. In the first preferred embodiment, a structure that implements the piston mode is not particularly limited as long as the longitudinally coupled resonator elastic wave filter as the first bandpass filter 5 implements the piston mode.

FIG. 14 is a partially cutout plan view illustrating an example of an electrode structure that implements the piston mode in the first preferred embodiment. That is, in the IDT electrode, a region in which electrode fingers connected to one potential and electrode fingers connected to the other potential overlap with each other in the elastic wave propagation direction is an intersection region. In the intersection region, edge regions with a lower sound velocity than that in a center region are formed at both sides of the center region in the direction in which the electrode fingers extend, thereby implementing the piston mode. A process of implementing the piston mode is not particularly limited.

The longitudinally coupled resonator elastic wave filter 11 in the present preferred embodiment significantly reduces or prevents the transverse mode ripples by implementing the piston mode in the first IDT electrode 31.

The first IDT electrode 31 includes a first busbar 111 and a second busbar 112 spaced away from the first busbar 111. The first busbar 111 and the second busbar 112 extend in parallel or substantially in parallel with the elastic wave propagation direction.

The base ends of a plurality of first electrode fingers 113 are connected to the first busbar 111. The front ends of the plurality of first electrode fingers 113 extend toward the second busbar 112 side from the first busbar 111. That is, the plurality of first electrode fingers 113 extend in the direction orthogonal or substantially orthogonal to the elastic wave propagation direction.

On the other hand, the base ends of a plurality of second electrode fingers 114 are connected to the second busbar 112. The front ends of the plurality of second electrode fingers 114 extend toward the first busbar 111 side from the second busbar 112. That is, the plurality of second electrode fingers 114 also extends in the direction orthogonal or substantially orthogonal to the elastic wave propagation direction.

The plurality of first electrode fingers 113 and the plurality of second electrode fingers 114 interpose each other. Each of the first electrode fingers 113 includes large width portions 113a, 113b, 113c, and 113d. Each of the second electrode fingers 114 also includes large width portions 114a, 114b, 114c, and 114d. The shapes of the large width portions 113a to 113d and 114a to 114d will be described with respect to the large width portion 113a as a representative component. A dimension of the large width portion 113a in the width direction, that is, a dimension thereof along the elastic wave propagation direction is larger than that of a remaining portion of the first electrode finger 113. In the first preferred embodiment, the large width portion 113a includes an isosceles trapezoid shape projecting in the elastic wave propagation direction from each of the side edges of the first electrode finger 113. The large width portions are not limited to include this shape and projecting portions with various shapes, for example, as semicircular-shaped projecting portions, may project in the elastic wave propagation direction from the side edges of the first electrode finger 113.

The large width portions 113a and 113b are close to the base end side of the first electrode finger 113 in the first electrode finger 113. In other words, the large width portions 113a and 113b are located close to the first busbar 111 side. On the other hand, the large width portions 113c and 113d are close to the front end side of the first electrode finger 113, that is, the second busbar 112 side.

The second electrode finger 114 includes the large width portions 114a and 114b at the front end side. The large width portions 114a and 114b and the large width portions 113a and 113b are alternately provided in the direction orthogonal or substantially orthogonal to the elastic wave propagation direction, that is, the direction in which the electrode fingers extend in a region close to the first busbar 111. Similarly, the large width portions 113c and 113d and the large width portions 114c and 114d are alternately provided in the above-described direction in which the electrode fingers extend at the side close to the second busbar 112.

A region V2 illustrated in FIG. 14 is located in a region in which the above-described large width portions 113a and 113b and large width portions 114a and 114b are provided. V1 to V6 at the right side in FIG. 14 indicate regions provided from the center of the first IDT electrode 31 toward outer side portions in the direction orthogonal or substantially orthogonal to the elastic wave propagation direction. FIG. 14 schematically illustrates velocities $V_1$ to $V_6$ (hereinafter, referred to as acoustic velocities) of elastic waves propagating in the regions V1 to V6, respectively. Hereinafter, in the specification, an acoustic velocity in a region Vn (n is a natural number) is expressed as $V_n$. The region V1 is an IDT center region located between the above-described large width portions 113b and large width portions 113c.

The acoustic velocity in the region V2 in which the large width portions 113a, 113b, 114a, and 114b are provided is lower than that in the region V1 as the IDT center region.

In the first preferred embodiment, projecting portions 113e projecting in an electrode finger width direction are provided at the base ends of the first electrode fingers 113. Accordingly, the acoustic velocity in the region V3 in which the projecting portions 113e are provided is lower than that in the region V5 in a high acoustic velocity portion, which will be described later. The acoustic velocity $V_3$ in the region V3 is higher than the acoustic velocity $V_2$ in the region V2 because no second electrode finger 114 is present in the region V3. It should be noted that projecting portions 114e are also provided in the second electrode fingers 114.

The region V2 with the lower acoustic velocity is provided by providing the large width portions 113a, 113b, 114a, and 114b as described above is also disclosed in International Publication No. WO 2012/086639 A1 and Japanese Unexamined Patent Application Publication No. 2000-286663. A region in which the large width portions 113c, 113d, 114c, and 114d are provided at the second busbar 112 side is similarly the region V2.

In the first preferred embodiment, the first busbar 111 includes the inner busbar portion 111A, a center busbar portion 111B, and an outer busbar portion 111C. The inner side indicates the side of the first and second electrode fingers 113 and 114 being present in the direction in which the electrode fingers of the IDT electrode extend in the first IDT electrode 31, and the outer side indicates the opposite side thereto.

The inner busbar portion 111A is a portion to which the base ends of the plurality of first electrode fingers 113 are connected. In the preferred embodiment, the inner busbar portion 111A includes an elongated band shape extending in the elastic wave propagation direction. The inner busbar portion 111A is a metalized portion and therefore defines the region V4 with a low acoustic velocity.

A plurality of cavities 115 is dispersedly located along the elastic wave propagation direction in the center busbar portion 111B. In the first preferred embodiment, the cavities 115 are located between coupling portions 116 and 116 extending in the direction in which the electrode fingers extend. In the first preferred embodiment, the coupling portions 116 include the same or substantially the same widths as those of the first electrode fingers 113 and are located at extended places of the first electrode fingers 113. Dimensions and positions of the coupling portions 116 are not limited thereto. Furthermore, although the cavities 115 preferably have rectangular or substantially rectangular shapes in the first preferred embodiment, the shapes thereof are not limited to the rectangular or substantially rectangular shapes.

The coupling portions 116 and the cavities 115 are alternately provided along the elastic wave propagation direction in the center busbar portion 111B. Accordingly, a large area of the center busbar portion 111B is not metalized and the center busbar portion 111B therefore defines the region V5 with a high acoustic velocity. The outer busbar portion 111C does not include cavity. Accordingly, the outer busbar portion 111C is a metalized region and the region V6 is a region with a low acoustic velocity.

An inner busbar portion 112A, a center busbar portion 112B, and an outer busbar portion 112C are similarly provided at the second busbar 112 side. The same reference numerals denote the same or similar portions and description thereof is omitted.

The first IDT electrode 31 includes features and elements as described above in the longitudinally coupled resonator elastic wave filter 11. Therefore, the low acoustic velocity regions are provided in outer side portions of the center region V1 and the high acoustic velocity regions V5 are present in outer side portions of the regions V2 to V4 as the low acoustic velocity regions. Accordingly, the piston mode is able to be provided and the transverse mode ripples are able to be significantly reduced or prevented.

In the longitudinally coupled resonator elastic wave filter 11, the first IDT electrodes 32 to 39 are similar to the first IDT electrode 31. Accordingly, the longitudinally coupled resonator elastic wave filter 11 is able to significantly reduce or prevent the transverse mode ripples by providing the piston mode.

In the first preferred embodiment, the above-described first IDT electrode 31 is able to significantly reduce or prevent the transverse mode ripples more effectively and provide a significantly improved piston mode. This point will be described with reference to FIG. 14 to FIG. 17.

Figure 16:
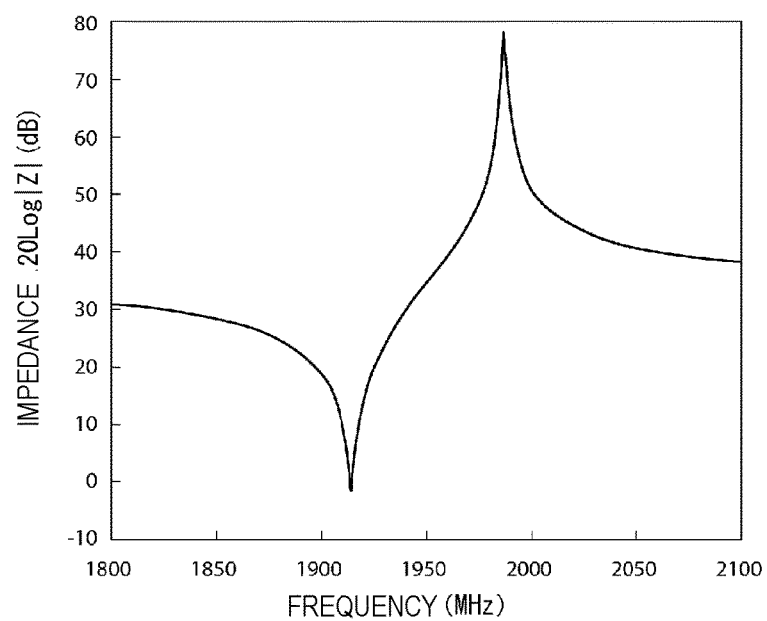
FIG. 16 is a graph illustrating impedance-frequency characteristics of a one port elastic wave resonator including an IDT electrode illustrated in FIG. 14.

For ease of comparison, characteristics of an elastic wave resonator in which reflectors were provided at both sides of the first IDT electrode 31 were measured. FIG. 16 is a graph illustrating impedance-frequency characteristics of the elastic wave resonator including the above-described first IDT electrode 31.

Figure 15:
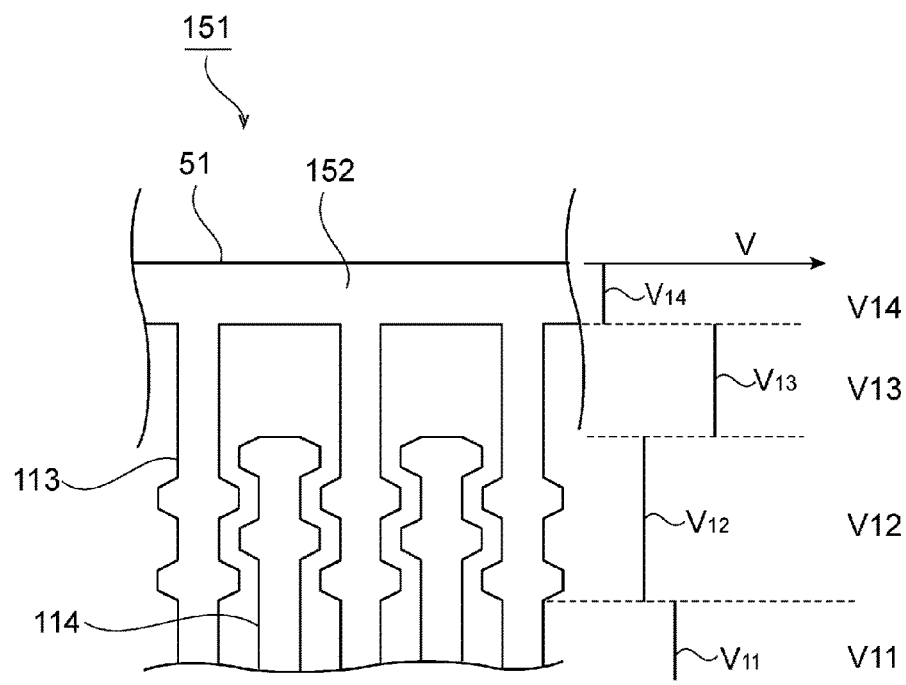
FIG. 15 is a partially cutout plan view showing a variation on a primary portion of an IDT electrode of a longitudinally coupled resonator elastic wave filter.

An IDT electrode 51 in a variation, which is illustrated in FIG. 15, was prepared. A one port elastic wave resonator including the IDT electrode 51 in the variation was manufactured. A one port elastic wave resonator 151 includes a first busbar 152 with only a wide metalized region including a band shape. Accordingly, a portion in which the first busbar 152 is provided is a region with a low acoustic velocity, which is indicated by V14. FIG. 15 schematically illustrates, at the right side, acoustic velocities $V_{11}$ to $V_{14}$ in respective regions V11 to V14 in the direction in which the electrode fingers of the IDT electrode 51 extend in the elastic wave resonator in the variation.

Figure 17:
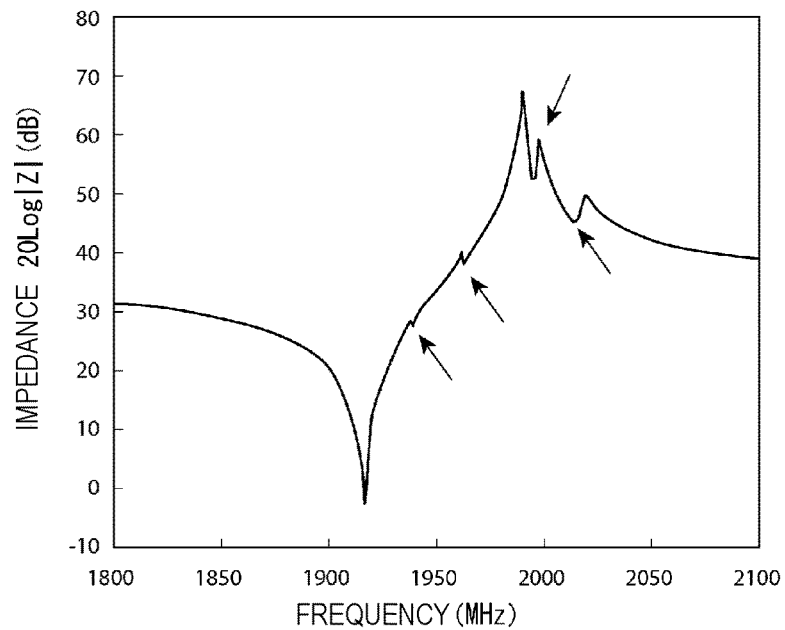
FIG. 17 is a graph illustrating impedance-frequency characteristics of a one port elastic wave resonator including an IDT electrode illustrated in FIG. 15.

FIG. 17 is a graph illustrating impedance-frequency characteristics of the one port elastic wave resonator in the variation.

As shown by a comparison between FIG. 16 and FIG. 17, in FIG. 17, ripples are generated between a resonant frequency and an anti-resonant frequency and at a high-frequency side relative to the anti-resonant frequency. The ripples are the transverse mode ripples. Also in the characteristics illustrated in FIG. 17, the transverse mode ripples are significantly reduced or prevented to a certain degree by providing the above-described large width portions. As illustrated in FIG. 16, the transverse mode ripples are able to be significantly reduced or prevented and little transverse mode ripple is generated with the first preferred embodiment.

In the first preferred embodiment, the acoustic velocities $V_1$ to $V_6$ in the respective regions V1 to V6 are as illustrated in FIG. 14. That is, an average value of the acoustic velocities in the regions V2, V3, and V4 as the low acoustic velocity regions is lowered by providing the inner busbar portion 111A in addition to the large width portions 113a, 113b, 114a, and 114b.

Accordingly, an acoustic velocity difference ΔV between the low acoustic velocity regions and the center region is extremely large. It is therefore considered that the transverse mode ripples are able to be significantly reduced or prevented more effectively. That is, as the acoustic velocity difference ΔV is larger, the piston mode is generated more reliably and the transverse mode ripples are able to be significantly reduced or prevented.

As described above, the electrode structure that implements the piston mode in the longitudinally coupled resonator elastic wave filter is not limited to the above-described structure. That is, instead of the method in which the acoustic velocity is adjusted by providing the large width portions, a method in which the acoustic velocity is adjusted by laminating dielectric films on the electrode fingers, or the like, may be used.

With reference to FIGS. 1A and 1B again, the filter device 1 is able to significantly reduce or prevent the transverse mode ripples because the first bandpass filter 5 implements the above-described piston mode. On the other hand, the second bandpass filter 6 includes the above-described inclination structure in the IDT electrodes and the elastic wave confinement structure including the high acoustic velocity films and the low acoustic velocity films. Accordingly, the second bandpass filter 6 also significantly reduces or prevents deterioration in the insertion loss and is able to significantly increase the Q value.

In the filter device 1, the Q value in the filter characteristics is able to therefore be significantly increased.

A specific example of the above-described filter device 1 will be described with reference to FIG. 18 to FIG. 20.

Figure 18:
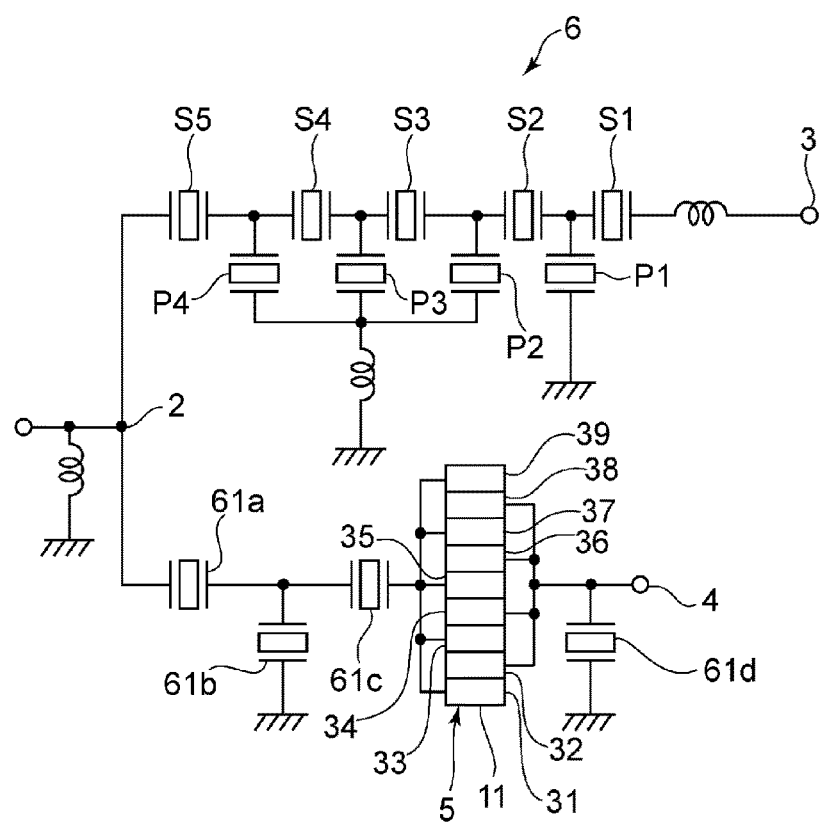
FIG. 18 is a circuit diagram of a filter device in an example 1.

FIG. 18 is a circuit diagram of a filter device in an example 1 as the example of the first preferred embodiment. The same reference numerals denote the same or similar portions as those in FIGS. 1A and 1B. In the ladder filter as the second bandpass filter 6, series arm resonators S1 to S5 and parallel arm resonators P1 to P4 are provided. The above-described series arm resonators S1 to S5 correspond to the above-described elastic wave resonators 21 and the parallel arm resonators P1 to P4 correspond to the elastic wave resonators 22.

The longitudinally coupled resonator elastic wave filter 11 as the first bandpass filter 5 was included as a 9-IDT type as in the first preferred embodiment, for example.

The electrode finger intersecting width was set to about 23 μm, for example. Wavelengths λ (μm) determined by pitches of the electrode fingers of the first IDT electrodes 31 to 39 and the number of pairs of electrode fingers were set as shown in the following Table 1. Furthermore, a wavelength determined by a pitch of electrode fingers of the reflectors was also set as shown in the following Table 1.

In Table 1, "narrow pitch" indicates a narrow-pitch electrode finger portion. "Main" indicates a remaining electrode finger portion other than the narrow-pitch electrode finger portion.

All of the duties of the IDT electrodes and the reflectors in the longitudinally coupled resonator elastic wave filter 11 were set to be about 0.5, for example. An interval between the first IDT electrode 31 and the reflector 40 and an interval between the first IDT electrode 39 and the reflector 41 were set to about $0.53\lambda_R$, for example. It should be noted that $\lambda_R$ is a wavelength determined by the pitch of the electrode fingers of the reflectors, that is, about 1.9759 μm, for example.

The numbers of electrode fingers of the reflectors were set to 30, for example.

Furthermore, elastic wave resonators 61a and 61c are electrically connected between the longitudinally coupled resonator elastic wave filter 11 and the antenna terminal 2. An elastic wave resonator 61b is electrically connected between a connection point of the elastic wave resonators 61a and 61c and a ground potential. Furthermore, an elastic wave resonator 61d is electrically connected between an output terminal of the longitudinally coupled resonator elastic wave filter 11 and the ground potential. These elastic wave resonators 61a to 61d define a trap and design parameters thereof were as shown in the following Table 2.

TABLE 1

|  | WAVELENGTH (μm) | IDT (NUMBER OF PAIRS) |
|---|---|---|
| REFLECTOR | 1.9759 | |
| IDTS 31 AND 39 MAIN | 1.9774 | 20.5 |
| IDTS 31 AND 39 NARROW PITCH | 1.7862 | 1.5 |
| IDTS 32 AND 38 NARROW PITCH (SIDES OF IDTS 31 AND 39) | 1.8404 | 1.0 |
| IDTS 32 AND 38 MAIN | 1.9248 | 12.1 |
| IDTS 32 AND 38 NARROW PITCH (SIDES OF IDTS 33 AND 37) | 1.8584 | 3.5 |
| IDTS 33 AND 37 NARROW PITCH (SIDES OF IDTS 32 AND 38) | 1.8746 | 4.0 |
| IDTS 33 AND 37 MAIN | 1.9691 | 17.0 |
| IDTS 33 AND 37 NARROW PITCH (SIDES OF IDTS 34 AND 36) | 1.871 | 4.0 |
| IDTS 34 AND 36 NARROW PITCH (SIDES OF IDTS 33 AND 37) | 1.8588 | 3.5 |
| IDTS 34 AND 36 MAIN | 1.9277 | 12.5 |
| IDTS 34 AND 36 NARROW PITCH (SIDE OF IDT 35) | 1.7877 | 1.0 |
| IDTS 35 NARROW PITCH | 1.8166 | 1.5 |
| IDTS 35 MAIN | 1.9781 | 33.0 |

TABLE 2

|  | ELASTIC WAVE RESONATOR | | | |
|---|---|---|---|---|
|  | 61a | 61b | 61c | 61d |
| IDT WAVELENGTH (μm) | 1.9045 | 1.9758 | 1.9198 | 1.9659 |
| REFLECTOR WAVELENGTH (μm) | 1.9045 | 1.9758 | 1.9198 | 1.9659 |
| INTERSECTING WIDTH (μm) | 15.3 | 42 | 27.8 | 20 |
| NUMBER OF PAIRS OF ELECTRODE FINGERS OF IDT | 70 | 68 | 229 | 62 |
| NUMBER OF ELECTRODE FINGERS OF REFLECTORS | 31 | 31 | 31 | 31 |
| DUTY | 0.5 | 0.5 | 0.5 | 0.5 |

The design parameters of the series arm resonators S1 to S5 and the parallel arm resonators P1 to P4 were as shown in the following Table 3.

TABLE 3

|  | S1 | P1 | S2 | P2 | S3 | P3 | S4 | P4 | S5 |
|---|---|---|---|---|---|---|---|---|---|
| IDT WAVELENGTH (μm) | 2.00105 | 2.0744 | 1.8157 | 2.0987 | 2.00865 | 2.0932 | 2.0308 | 2.1054 | 2.012067 |
| REFLECTOR WAVELENGTH (μm) | 2.00105 | 2.0744 | 1.8157 | 2.0987 | 2.00865 | 2.0932 | 2.0308 | 2.1054 | 2.012067 |
| INTERSECTING WIDTH (μm) | 24.8 | 32 | 26.4 | 39.1 | 22.7 | 52.4 | 32.5 | 79.1 | 28.3 |

TABLE 3-continued

|  | S1 | P1 | S2 | P2 | S3 | P3 | S4 | P4 | S5 |
|---|---|---|---|---|---|---|---|---|---|
| NUMBER OF PAIRS OF ELECTRODE FINGERS OF IDT | 100 | 57 | 224 | 89 | 69 | 82 | 150 | 62 | 100 |
| NUMBER OF ELECTRODE FINGERS OF REFLECTORS | 21 | 21 | 21 | 21 | 21 | 21 | 21 | 21 | 21 |
| DUTY | 0.5 | 0.5 | 0.5 | 0.5 | 0.5 | 0.5 | 0.5 | 0.5 | 0.5 |

In the filter device 1 in the example 1, the longitudinally coupled resonator elastic wave filter 11 included the lamination structure in which an $SiO_2$ film with a thickness of about 673 nm and a $LiTaO_3$ substrate with a thickness of about 600 nm were laminated on a high acoustic velocity support substrate including Si. Cut-Angles of $LiTaO_3$ were set to about 50°. The inclination angle v in the respective elastic wave resonators of the ladder filter was set to about 7.5°. Al with a thickness of 157 nm was included in the first and second IDT electrodes.

Figure 19:
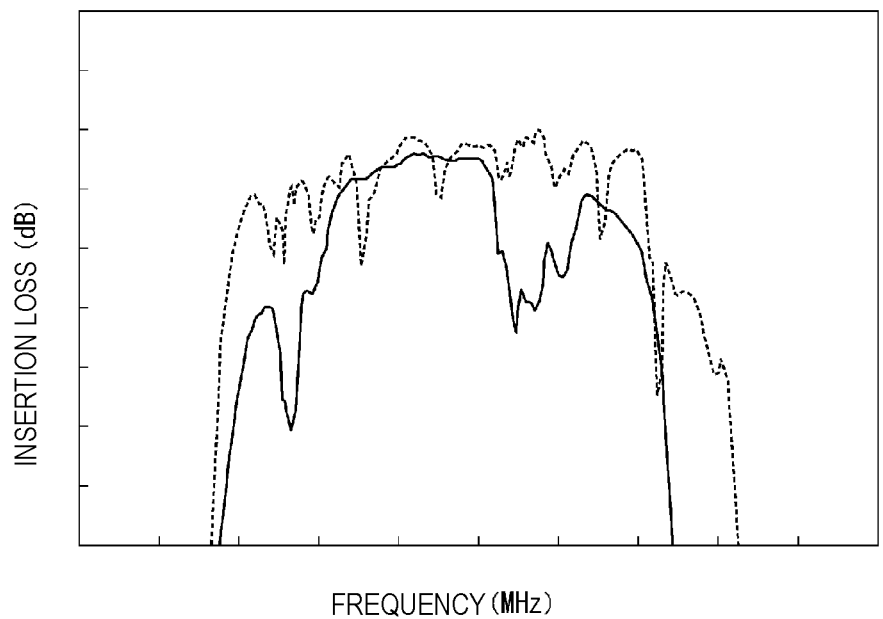
FIG. 19 is a graph illustrating attenuation-frequency characteristics of a longitudinally coupled resonator elastic wave filter in the filter device in the example 1 and a longitudinally coupled resonator elastic wave filter in a comparative example 3.

A dashed line in FIG. 19 indicates attenuation-frequency characteristics of the longitudinally coupled resonator elastic wave filter 11 implementing the piston mode in the example 1. As a comparative example 3 for comparison, prepared was a longitudinally coupled resonator elastic wave filter with similar features and elements, other than points that IDT electrodes including the same or substantially the same inclination structure as that in the ladder filter in the example 1 were provided and the piston mode was not implemented. A solid line in FIG. 19 indicates a result of the comparative example 3. As shown in FIG. 19, the longitudinally coupled resonator elastic wave filter 11 provided in the example 1 is able to significantly reduce or prevent the deterioration in the insertion loss in comparison with the comparative example 3 indicated by the solid line. Accordingly, the Q value of the filter device is able to be significantly increased.

Figure 20:
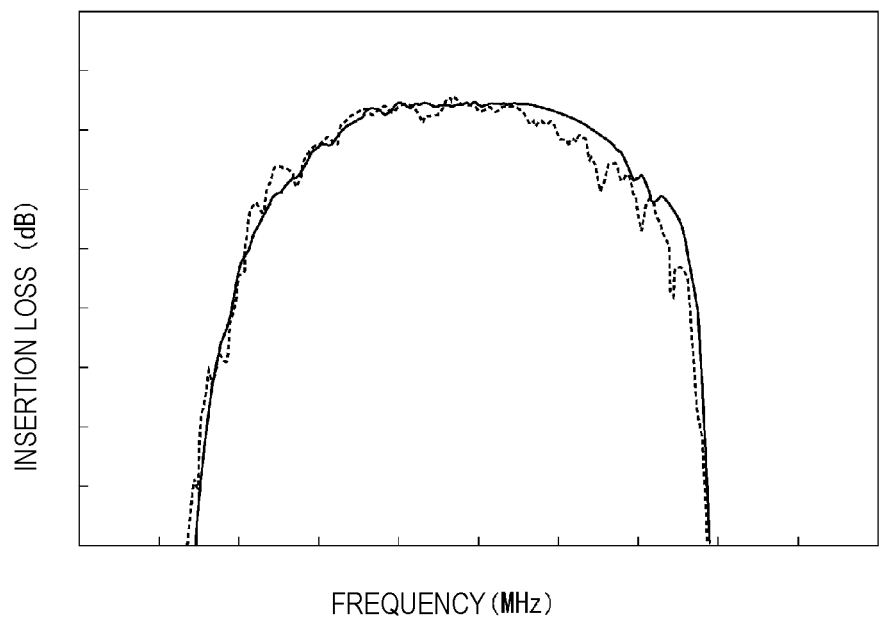
FIG. 20 is a graph illustrating attenuation-frequency characteristics of a ladder filter in the filter device in the example 1 and a ladder filter in a comparative example 4.

A solid line in FIG. 20 indicates attenuation-frequency characteristics of the ladder filter as the second bandpass filter 6 in the example 1. A dashed line indicates attenuation-frequency characteristics of a ladder filter prepared in a comparative example 4. In the comparative example 4, the piston mode as that implemented in the longitudinally coupled resonator elastic wave filter 11 in the example 1 was provided in the respective elastic wave resonators of the ladder filter, unlike the example 1. That is, the ladder filter included similar features and elements as the above-described example 1 other than a point that the piston mode was implemented without including the inclination IDTs with the inclination angle v of a positive value.

As shown in FIG. 20, the ladder filter that is included in the example 1 significantly reduces the deterioration in the insertion loss in comparison with the comparative example 4. Accordingly, the Q value is able to be significantly increased in the filter device 1.

As shown in FIG. 19 and FIG. 20, in the example 1, the longitudinally coupled resonator elastic wave filter 11 implements the piston mode and the second bandpass filter 6 as the ladder filter includes the inclination IDTs. Accordingly, both of the first and second bandpass filters 5 and 6 are able to significantly reduce or prevent the deterioration in the insertion loss and are able to significantly increase the Q value.

The first preferred embodiment provides the characteristics that the longitudinally coupled resonator elastic wave filter implements the piston mode without including the inclination IDTs as described above, and the ladder filter as the second bandpass filter includes the inclination IDTs without implementing the piston mode. With these characteristics, both of the first and second bandpass filters are able to significantly reduce or prevent the deterioration in the insertion loss.

Figure 21:
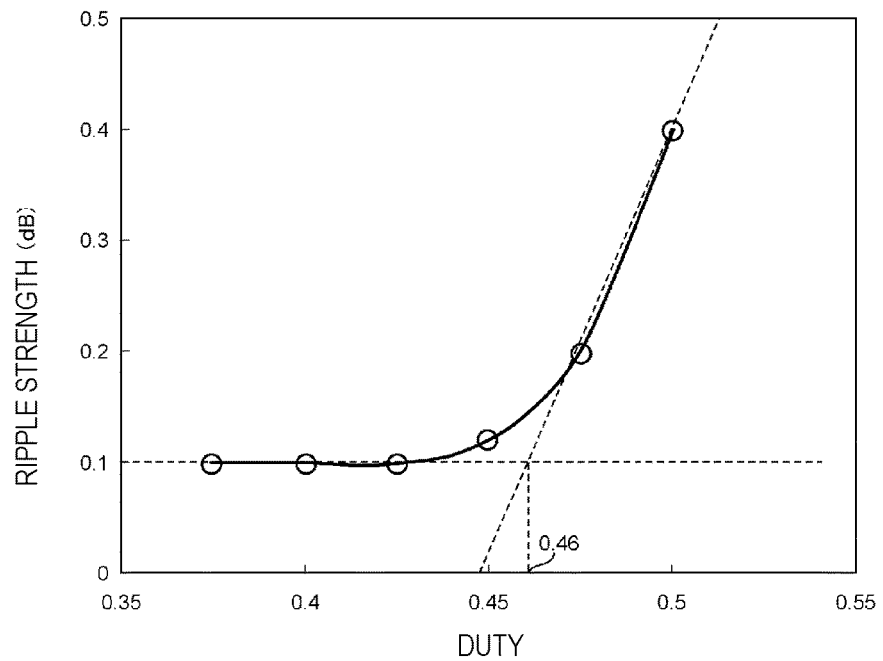
FIG. 21 is a graph illustrating a relation between a duty of first IDT electrodes in the longitudinally coupled resonator elastic wave filter and strength of a transverse mode ripple.

It is preferable that the duty of the first IDT electrodes in the longitudinally coupled resonator elastic wave filter 11 implementing the piston mode be equal to or lower than about 0.46, for example. FIG. 21 is a graph illustrating a relation between the duty of the first IDT electrodes and ripple strength. The ripple strength herein indicates a magnitude of a maximum or substantially maximum ripple generated in a pass band.

As shown in FIG. 21, if the duty is changed, when the duty is equal to or lower than about 0.46, the ripples are able to be significantly reduced or prevented in comparison with the case in which the duty is higher than about 0.46. Furthermore, variation in the ripple strength due to the change in the duty is significantly small.

In the first preferred embodiment, the structure connected to the longitudinally coupled resonator elastic wave filter 11 is not limited to the second bandpass filter 6 provided by the above-described ladder filter. That is, another second bandpass filter including a plurality of elastic wave resonators may be included. Alternatively, the first preferred embodiment also encompasses an elastic wave resonator that is electrically connected to the longitudinally coupled resonator elastic wave filter 11 instead of the second bandpass filter.

For example, in FIG. 18, at least one elastic wave resonator among the elastic wave resonators 61a to 61d defining the trap may include the above-described inclination IDT structure. In this case, in a connecting structure between the elastic wave resonator including the inclination IDT structure and the longitudinally coupled resonator elastic wave filter 11, the longitudinally coupled resonator elastic wave filter 11 is able to significantly reduce or prevent the deterioration in the insertion loss as described above, and the elastic wave resonator side is able to significantly reduce or prevent the deterioration in the insertion loss with the inclination IDT structure.

The filter device according to the first preferred embodiment may include the longitudinally coupled resonator elastic wave filter 11 and at least one elastic wave resonator is electrically connected without providing the second bandpass filter.

Furthermore, as illustrated in FIGS. 1A and 1B, in the first preferred embodiment, the first bandpass filter 5 and the second bandpass filter 6 are integrated on the $LiTaO_3$ film 7 as the common piezoelectric film. That is, the filter device 1 is a single chip component. Accordingly, the filter device is able to be reduced in size and an electronic apparatus on which the filter device 1 is mounted is able to be reduced in size.

Figure 22:
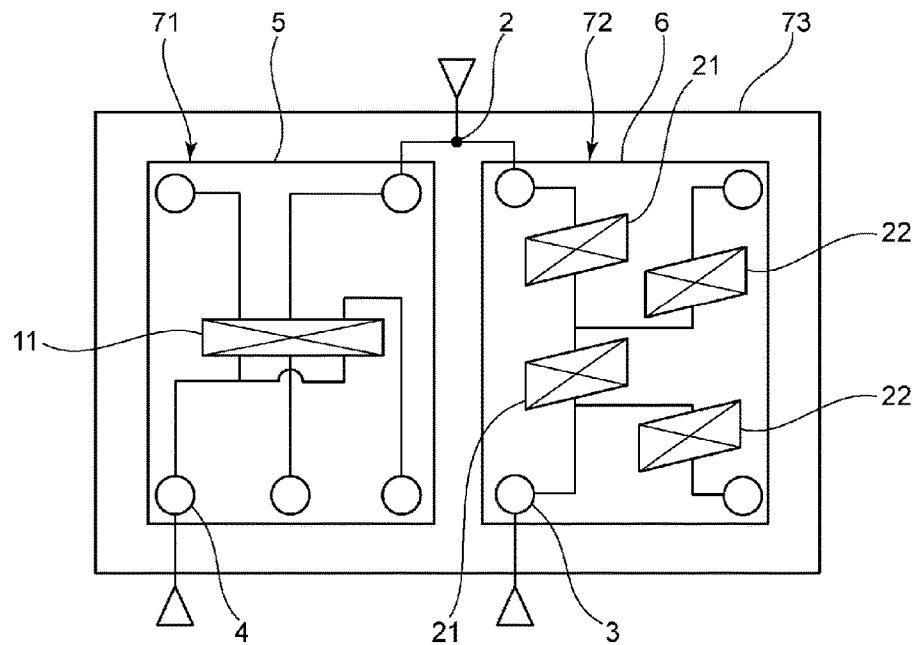
FIG. 22 is a schematic plan view of a filter device according to a second preferred embodiment of the present invention.

FIG. 22 is a schematic plan view of a filter device according to a second preferred embodiment of the present invention. The first bandpass filter 5 and the second bandpass filter 6 may be, respectively, different chip components of a first chip component 71 and a second chip component 72, as illustrated in FIG. 22. The first chip component 71 and the second chip component 72 are mounted on a mounting substrate 73.

It is sufficient that at least one of the elastic wave resonators of the series arm resonators S1 to S5 and the parallel arm resonators P1 to P4 are defined as the elastic wave resonators 21 and 22 with the inclination angles ν as illustrated in FIG. 1B.

The elastic wave resonators 21 and 22 with the inclination angles ν as illustrated in FIG. 1B may be included in the elastic wave resonators 61*a*, 61*b*, 61*c*, and 61*d* illustrated in FIG. 18. The elastic wave resonators 21 and 22 may be included in all of the elastic wave resonators 61*a*, 61*b*, 61*c*, and 61*d* or at least one of elastic wave resonators 61*a*, 61*b*, 61*c*, and 61*d*.

Furthermore, the first bandpass filter 5 in FIG. 18 may be a reception filter and the second bandpass filter 6 may be a transmission filter.

Figure 28A:
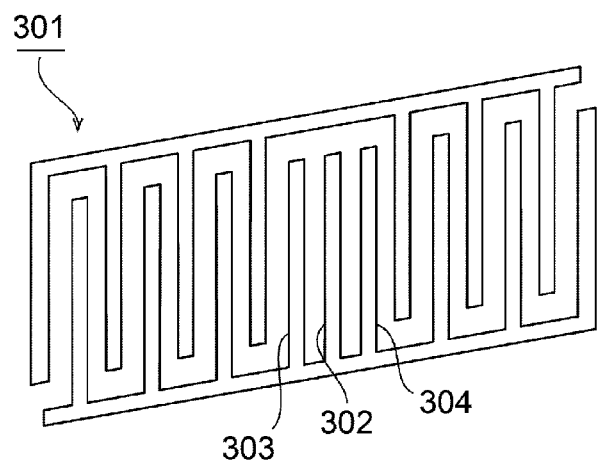
FIGS. 28A and 28B are plan views illustrating variations on an inclination IDT.
Figure 28B:
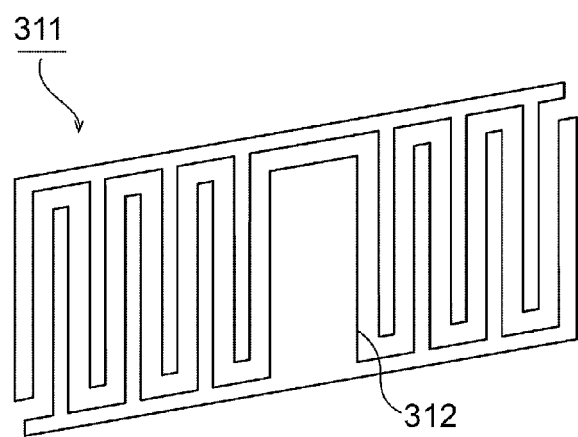

FIGS. 28A and 28B are plan views illustrating variations of the inclination IDT.

As in an inclination IDT 301 illustrated in FIG. 28A, an electrode finger 302 electrically connected to the same or substantially the same potential may be provided between electrode fingers 303 and 304 electrically connected to the same or substantially the same potential. That is, one electrode finger of the plurality of first electrode fingers and the plurality of second electrode fingers that interpose each other may be partially thinned out.

As in an inclination IDT 311 illustrated in FIG. 28B, an electrode finger 312 with a large width may be provided. An outer shape of the electrode finger 312 includes the same or substantially the same outer shape as a portion in which the above-described electrode fingers 303 and 304 and the electrode fingers 302 are provided. That is, the electrode finger 312 with the large width is provided to fill a region in which the electrode fingers 303 and 304 and the electrode finger electrically connected to the other potential are thinned out.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a longitudinally coupled resonator elastic wave filter that includes a plurality of first IDT electrodes including low acoustic velocity regions in outer side portions of center regions of the first IDT electrodes and high acoustic velocity regions in outer side portions of the low acoustic velocity regions in a direction orthogonal or substantially orthogonal to an elastic wave propagation direction, and defines and functions as a first bandpass filter;
   an elastic wave resonator that is electrically connected to the longitudinally coupled resonator elastic wave filter;
   a piezoelectric film including $LiTaO_3$; and
   a high acoustic velocity member with an acoustic velocity of propagating bulk waves, which is higher than an acoustic velocity of elastic waves propagating in the piezoelectric film; wherein
   the piezoelectric film is laminated directly or indirectly on the high acoustic velocity member;
   the plurality of first IDT electrodes are longitudinally coupled and connected on one surface of the piezoelectric film;
   the elastic wave resonator includes a second IDT electrode located on one surface of the piezoelectric film;
   the second IDT electrode includes a plurality of first electrode fingers and a plurality of second electrode fingers which interpose with the first electrode fingers;
   a film thickness of the piezoelectric film is equal to or smaller than about 10λ when a wavelength determined by a pitch of the first and second electrode fingers of the second IDT electrode is λ; and
   a direction connecting front ends of the plurality of first electrode fingers and a direction connecting front ends of the plurality of second electrode fingers define an inclination angle of ν with respect to a propagation direction φ of elastic waves excited by the second IDT electrode, which is determined by Euler Angles (φ, θ, φ) of the $LiTaO_3$, where ν is a positive value of larger than 0°.

2. The filter device according to claim 1, wherein a thickness of the piezoelectric film is equal to or smaller than about 1.5λ.

3. The filter device according to claim 1, wherein the elastic wave resonator includes a plurality of elastic wave resonators electrically connected to define a second bandpass filter.

4. The filter device according to claim 3, wherein the second bandpass filter is a ladder filter.

5. The filter device according to claim 3, wherein the filter device is a duplexer including the longitudinally coupled resonator elastic wave filter as a reception filter and the second bandpass filter as a transmission filter.

6. The filter device according to claim 3, wherein the first bandpass filter and the second bandpass filter are provided on a single chip component.

7. The filter device according to claim 3, wherein
   the first bandpass filter is provided in a first chip component;
   the second bandpass filter is provided on a second chip component; and
   the first chip component is different from the second chip component.

8. The filter device according to claim 7, wherein the first chip component and the second chip component are both mounted on a mounting substrate.

9. The filter device according to claim 1, wherein a low acoustic velocity film with an acoustic velocity of propagating bulk waves, which is lower than the acoustic velocity of the elastic waves propagating in the piezoelectric film, is laminated between the high acoustic velocity member and the piezoelectric film, and the piezoelectric film is laminated indirectly on the high acoustic velocity member.

10. The filter device according to claim 1, wherein the piezoelectric film is laminated directly on the high acoustic velocity member.

11. The filter device according to claim 1, wherein
    each of the first IDT electrodes includes a first busbar, a second busbar spaced away from the first busbar, a plurality of first electrode fingers base ends of which are electrically connected to the first busbar and front ends of which extend toward the second busbar, and a plurality of second electrode fingers base ends of which are connected to the second busbar and front ends of which extend toward the first busbar; and in each of the first IDT electrodes of the longitudinally coupled resonator elastic wave filter:

when a direction orthogonal or substantially orthogonal to a direction in which the first and second electrode fingers extend is a width direction, at least one of each of the first and second electrode fingers includes large width portions with larger dimensions in the width direction than dimensions of portions of the first and second electrode fingers at a center in a lengthwise direction at at least one side of the base end side and the front end side relative to the center in the lengthwise direction;

at least one of the first and second busbars includes a plurality of cavities which are located along a lengthwise direction of the first or second busbar; and each of the first and second busbars includes an inner busbar portion which is located at a side of the first or second electrode fingers relative to the cavities and extends in the lengthwise direction of the first and second busbars, a center busbar portion in which the cavities are provided, and an outer busbar portion located at an opposite side to the inner busbar portion with the center busbar portion interposed between the outer busbar portion and the inner busbar portion.

12. The filter device according to claim 11, wherein the inner busbar portion includes a band shape extending in the elastic wave propagation direction.

13. The filter device according to claim 11, wherein both of the first electrode fingers and the second electrode fingers include the large width portions.

14. The filter device according to claim 1, wherein each of the first IDT electrodes includes a first busbar, a second busbar spaced away from the first busbar, a plurality of first electrode fingers base ends of which are electrically connected to the first busbar and front ends of which extend toward the second busbar, and a plurality of second electrode fingers base ends of which are connected to the second busbar and front ends of which extend toward the first busbar;

when a region in which the plurality of first electrode fingers and the plurality of second electrode fingers overlap with each other in the elastic wave propagation direction is an intersection region, the intersection region includes the center regions in the direction orthogonal or substantially orthogonal to the elastic wave propagation direction and the low acoustic velocity regions provided in the outer side portions of the center regions;

the first and second electrode fingers are increased in thickness in the low acoustic velocity regions; and an acoustic velocity in the low acoustic velocity regions is lower than the acoustic velocity in the center regions.

15. The filter device according to claim 1, wherein each of the first IDT electrodes includes a first busbar, a second busbar spaced away from the first busbar, a plurality of first electrode fingers base ends of which are electrically connected to the first busbar and front ends of which extend toward the second busbar, and a plurality of second electrode fingers base ends of which are connected to the second busbar and front ends of which extend toward the first busbar; and a dielectric film that lowers an acoustic velocity is laminated on the first and second electrode fingers in the low acoustic velocity regions.

16. The filter device according to claim 15, wherein the dielectric film laminated on the first and second electrode fingers extends along the elastic wave propagation direction.

17. The filter device according to claim 1, wherein a duty in the first IDT electrodes of the longitudinally coupled resonator elastic wave filter is equal to or lower than about 0.46.

18. The filter device according to claim 1, wherein the inclination angle v is in a range of equal to or larger than about 0.4° and equal to or smaller than about 15°.

19. The filter device according to claim 1, wherein the high acoustic velocity member is a high acoustic velocity support substrate.

20. The filter device according to claim 1, further comprising a support substrate, wherein the high acoustic velocity member is a high acoustic velocity film and is provided on the support substrate.

* * * * *